US012166017B2

(12) United States Patent
Lim et al.

(10) Patent No.: US 12,166,017 B2
(45) Date of Patent: Dec. 10, 2024

(54) LIGHT-EMITTING DEVICE COMPRISING BANKS AND ELECTRODES THEREON, AND DISPLAY DEVICE COMPRISING SAME

(71) Applicant: Samsung Display Co., Ltd., Yongin-si (KR)

(72) Inventors: Jae Ik Lim, Yongin-si (KR); Hae Yun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 828 days.

(21) Appl. No.: 17/258,621

(22) PCT Filed: Dec. 19, 2018

(86) PCT No.: PCT/KR2018/016252
§ 371 (c)(1),
(2) Date: Jan. 7, 2021

(87) PCT Pub. No.: WO2020/013407
PCT Pub. Date: Jan. 16, 2020

(65) Prior Publication Data
US 2021/0272937 A1 Sep. 2, 2021

(30) Foreign Application Priority Data
Jul. 10, 2018 (KR) .................. 10-2018-0080156

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/24* (2013.01);
(Continued)

(58) Field of Classification Search
CPC . H01L 25/0753; H01L 27/1214; H01L 33/24; H01L 33/58; H01L 33/62; H01L 33/22
See application file for complete search history.

(56) References Cited

U.S. PATENT DOCUMENTS 8,890,127 B2   11/2014  Yamazaki et al.
8,921,872 B2   12/2014  Ichikawa et al.
(Continued)

FOREIGN PATENT DOCUMENTS

CN     103165645 A    6/2013
CN     107068899 A    8/2017
(Continued)

OTHER PUBLICATIONS

International Search Report for corresponding International Application No. PCT/KR2018/016252, dated May 30, 2019, 3pp.

*Primary Examiner* — William B Partridge
*Assistant Examiner* — David Paul Sedorook
(74) *Attorney, Agent, or Firm* — Lewis Roca Rothgerber Christie LLP

(57) ABSTRACT

A light emitting device including: a substrate; a light emitting element on the substrate, and having a first end and a second end in a longitudinal direction; first and second banks on the substrate and spaced apart from each other with the light emitting element interposed therebetween; a first electrode on the first bank and adjacent to the first end of the light emitting element; a second electrode on the second bank and adjacent to the second end of the light emitting element; a first contact electrode coupling the first electrode and the first end of the light emitting element, and a second contact electrode coupling the second electrode and the second end of the light emitting element. When viewed on a plane, the first electrode partially overlaps the first bank, and the second electrode partially overlaps the second bank.

18 Claims, 23 Drawing Sheets

(51) Int. Cl.
  *H01L 33/24* (2010.01)
  *H01L 33/58* (2010.01)
  *H01L 33/62* (2010.01)

(52) U.S. Cl.
  CPC .............. *H01L 33/58* (2013.01); *H01L 33/62* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 8,981,638 B2 | 3/2015 | Isa | |
| 8,999,836 B2* | 4/2015 | Oikawa | H10K 50/818 |
| | | | 438/609 |
| 9,356,082 B2 | 5/2016 | Isa | |
| 9,557,573 B2 | 1/2017 | Hilarius et al. | |
| 9,570,425 B2 | 2/2017 | Do | |
| 9,773,761 B2 | 9/2017 | Do | |
| 9,818,725 B2* | 11/2017 | Bower | H01L 25/0655 |
| 9,910,320 B2 | 3/2018 | Kwak | |
| 10,026,777 B2 | 7/2018 | Kang et al. | |
| 10,181,546 B2 | 1/2019 | Zou et al. | |
| 10,181,580 B2* | 1/2019 | Ishida | H10K 77/111 |
| 10,461,123 B2 | 10/2019 | Kim et al. | |
| 2015/0187857 A1 | 7/2015 | Negishi et al. | |
| 2015/0252960 A1 | 9/2015 | Song et al. | |
| 2016/0351636 A1 | 12/2016 | Lee et al. | |
| 2017/0062397 A1* | 3/2017 | Park | H01L 27/1248 |
| 2017/0170373 A1* | 6/2017 | Peng | H01L 27/1248 |
| 2018/0175009 A1 | 6/2018 | Kim et al. | |
| 2018/0175106 A1* | 6/2018 | Kim | H01L 33/385 |
| 2019/0115508 A1* | 4/2019 | Lin | H01L 31/02325 |
| 2020/0411492 A1* | 12/2020 | Ju | H01L 25/0753 |

FOREIGN PATENT DOCUMENTS

| | | |
|---|---|---|
| CN | 108206228 A | 6/2018 |
| KR | 10-2014-0017435 A | 2/2014 |
| KR | 10-1436123 B1 | 11/2014 |
| KR | 10-1490758 B1 | 2/2015 |
| KR | 10-2015-0069712 A | 6/2015 |
| KR | 10-2017-0079854 A | 7/2017 |
| KR | 10-2017-0082696 A | 7/2017 |
| KR | 10-2018-0011404 A | 2/2018 |
| KR | 10-2018-0071465 A | 6/2018 |
| KR | 10-2018-0072909 A | 7/2018 |
| KR | 10-2023795 B1 | 9/2019 |
| KR | 10-2019-0124359 A | 11/2019 |

* cited by examiner

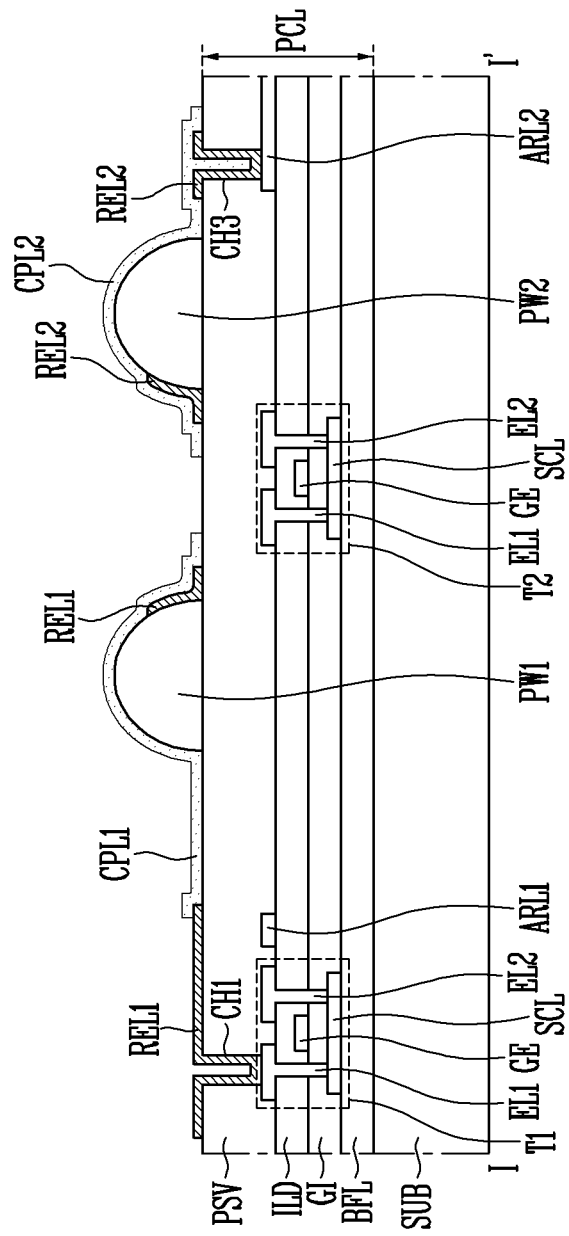

LIGHT-EMITTING DEVICE COMPRISING BANKS AND ELECTRODES THEREON, AND DISPLAY DEVICE COMPRISING SAME

CROSS-REFERENCE TO RELATED APPLICATIONS

This application is a U.S. National Phase Patent Application of International Patent Application Number PCT/KR2018/016252, filed on Dec. 19, 2018, which claims priority to Korean Patent Application No. 10-2018-0080156, filed Jul. 10, 2018, the entire contents of both of which are incorporated herein by reference.

TECHNICAL FIELD

Various embodiments of the present disclosure relate to a light emitting device and a display device having the same.

BACKGROUND ART

A light emitting diode (hereinafter, referred to as an "LED") may have relatively satisfactory durability even under poor environmental conditions, and have excellent performance in terms of lifetime and luminance. Recently, research into the technology of applying such LEDs to various display devices has become appreciably more active.

As a part of such research, technologies for fabricating a rod-type LED having a very small size corresponding to the micro scale or the nano scale by using an inorganic crystalline structure, e.g., a structure obtained by growing a nitride-based semiconductor are being developed. For example, the rod-type LED may be fabricated having a small enough size to form a pixel of a self-light emissive display device, etc.

DISCLOSURE

Technical Problem

Various embodiments of the present disclosure are directed to a light emitting device including a rod-type LED and a display device having the light emitting device.

Technical Solution

According to an embodiment of the present disclosure, a light emitting device may include a substrate; a light emitting element on the substrate and the light emitting element having a first end and a second end in a longitudinal direction; first and second banks (or partition walls) on the substrate, the first and second partition walls being spaced apart from each other by a distance, with the light emitting element interposed therebetween; a first electrode on the first partition wall and adjacent to the first end of the light emitting element; a second electrode on the second partition wall and adjacent to the second end of the light emitting element; a first contact electrode coupling the first electrode with the first end of the light emitting element; and a second contact electrode coupling the second electrode with the second end of the light emitting element. When viewed on a plane, the first electrode may partially overlap the first partition wall, and the second electrode may partially overlap the second partition wall.

In an embodiment, the first electrode may be on a side surface of the first partition wall, and the second electrode may be on a side surface of the second partition wall.

In an embodiment, the light emitting device may further include a passivation layer between the first and second partition walls and the substrate; a first insulating layer between the passivation layer and the light emitting element; a second insulating layer on the light emitting element and exposing the first and second ends of the light emitting element to an outside; a third insulating layer on and covering the first contact electrode; and a fourth insulating layer provided on and covering the second contact electrode.

In an embodiment, the third insulating layer and the fourth insulating layer may include an insulating material having the same refractive index as that of the first and second electrodes.

In an embodiment, the light emitting device may further include first and second alignment lines between the substrate and the passivation layer and extending in one direction when viewed on the plane.

In an embodiment, the first alignment line may be electrically coupled to the first electrode, and the second alignment line may be electrically coupled to the second electrode.

In an embodiment, the light emitting device may further include a first encapsulation layer between the first electrode and the first contact electrode and covering the first electrode; and a second encapsulation layer between the second electrode and the second contact electrode and covering the second electrode.

In an embodiment, the light emitting element may include a first semiconductor layer (or conductive semiconductor layer) doped with a first conductive dopant; a second semiconductor layer (or conductive semiconductor layer) doped with a second conductive dopant; and an active layer between the first conductive semiconductor layer and the second conductive semiconductor layer. The light emitting element may include a light emitting diode having a cylindrical shape having a micro scale or a nano scale or a prismatic shape having a micro scale or a nano scale.

According to an embodiment of the present disclosure, a display device may include a substrate having a display area and a non-display area; a pixel circuit component in the display area of the substrate and including a transistor and a passivation layer on the transistor; and a display element layer on the passivation layer, and including a light emitting element having a first end and a second end in a longitudinal direction. The display element layer may include first and second partition walls on the passivation layer and spaced apart from each other by a distance with the light emitting element interposed therebetween; a first electrode on the first partition wall and adjacent to the first end of the light emitting element; a second electrode on the second partition wall and adjacent to the second end of the light emitting element; a first contact electrode coupling the first electrode and the first end of the light emitting element; and a second contact electrode coupling the second electrode and the second end of the light emitting element. When viewed on a plane, the first electrode may partially overlap the first partition wall, and the second electrode may partially overlap the second partition wall.

According to an embodiment of the present disclosure, a display device may include a substrate having a display area and a non-display area; a pixel circuit component in the display area of the substrate, and including a transistor and a passivation layer on the transistor; and a display element layer on the passivation layer and including a light emitting element having a first end and a second end in a longitudinal direction. The display element layer may include first and second partition walls on the passivation layer and spaced apart from each other by a distance with the light emitting element interposed therebetween; a first electrode on the first partition wall; a second electrode on the second partition wall; a first contact electrode coupling the first electrode and the first end of the light emitting element; a second contact electrode coupling the second electrode and the second end of the light emitting element; an insulating layer on the first and second contact electrodes; a light shielding pattern on the insulating layer; and a color filter layer on the light shielding pattern. When viewed on a plane, the first electrode completely overlaps the first partition wall, and the second electrode completely overlaps the second partition wall.

Advantageous Effects

According to embodiments of the present disclosure, a light emitting device having improving light emission efficiency and a display device having the light emitting device are provided.

DESCRIPTION OF DRAWINGS

FIG. 6b is a sectional view corresponding to the line I-I' of FIG. 5 illustrating an embodiment of the light emitting device of FIG. 6a.

FIGS. 8a to 8h are sectional views sequentially illustrating a method of manufacturing the display device shown in FIG. 6a.

MODE FOR INVENTION

Figure 1:
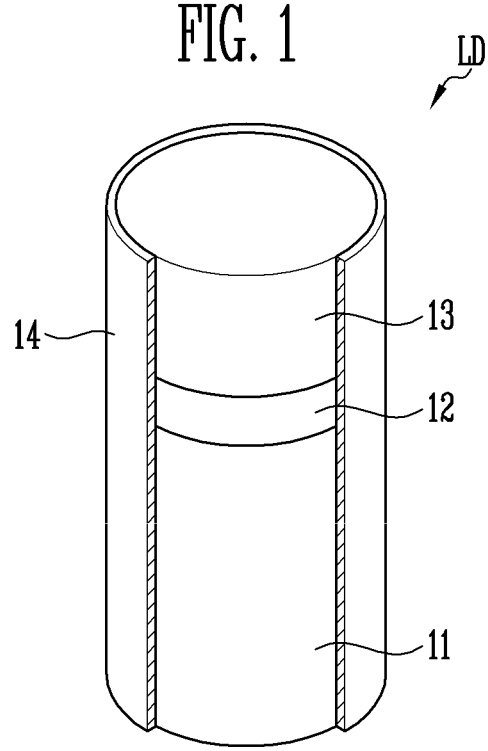
FIG. 1 is a perspective view illustrating a rod-type light emitting diode in accordance with an embodiment of the present disclosure.

As the present disclosure allows for various changes and numerous embodiments, example embodiments will be illustrated in the drawings and described, in detail, in the written description. However, this is not intended to limit the present disclosure to particular embodiments or modes of practice, and it is to be appreciated that all changes, equivalents, and substitutes that do not depart from the spirit and technical scope of the present disclosure are encompassed in the present disclosure.

Throughout the disclosure, like reference numerals refer to like elements throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise," "include," "have," etc., when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part, such as a layer, a film, a region, or a plate, is disposed on a second part, the first part may be not only directly on the second part but a third part may intervene between them. In addition, when it is expressed that a first part, such as a layer, a film, a region, or a plate, is formed on a second part, the surface of the second part on which the first part is formed is not limited to an upper surface of the second part but may include other surfaces, such as a side surface or a lower surface of the second part. When a first part, such as a layer, a film, a region, or a plate is under a second part, the first part may be not only directly under the second part but a third part may intervene between them.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, embodiments of the present disclosure will be described, in detail, with reference to the accompanying drawings.

FIG. 1 is a perspective view illustrating a rod-type light emitting diode LD in accordance with an embodiment of the present disclosure. Although the rod-type light emitting diode LD illustrated in FIG. 1 has a cylindrical shape, the present disclosure is not limited thereto.

Referring to FIG. 1, the rod-type light emitting diode LD in accordance with an embodiment of the present disclosure may include a first conductive semiconductor layer 11, a second conductive semiconductor layer 13, and an active layer 12 interposed between the first and second conductive semiconductor layers 11 and 13. The rod-type light emitting diode LD may be a light emitting element.

For example, the rod-type light emitting diode LD have a stacked body formed by successively stacking the first conductive semiconductor layer 11, the active layer 12, and the second conductive semiconductor layer 13. In the following description, for the convenience of explanation, the rod-type light emitting diode LD will be referred to as the "rod-type LED LD".

In an embodiment of the present disclosure, the rod-type LED LD may have the form of a rod extending in (e.g., primarily extending in) one direction. If the direction in which the rod-type LED LD extends (or primarily extends) is defined as a longitudinal direction, the rod-type LED LD may have a first end and a second end with respect to the longitudinal direction in which the rod-type LED LD extends.

In an embodiment, one of the first and second conductive semiconductor layers 11 and 13 may be disposed on the first end, and the other of the first and second conductive semiconductor layers 11 and 13 may be disposed on the second end.

In an embodiment, the rod-type LED LD may have a cylindrical shape. Herein, the term "rod-type" includes a rod-like shape or a bar-like shape, such as a cylindrical shape and a prismatic shape extending in the longitudinal direction (e.g., having an aspect ratio greater than 1). For example, the length of the rod-type LED LD may be greater than the diameter (or width) thereof.

The rod-type LED LD may be fabricated in a small size having a diameter and/or length corresponding to, for example, a micro-scale or nano-scale size.

However, the size of the rod-type LED LD is not limited thereto, and the size of the rod-type LED LD may be varied depending on requirements of the display device to which the rod-type LED LD is to be applied.

The first conductive semiconductor layer 11 may include, for example, at least one n-type semiconductor layer. For example, the first conductive semiconductor layer 11 may include a semiconductor layer including a semiconductor material of InAlGaN, GaN, AlGaN, InGaN, AlN, and InN and that is doped with a first conductive dopant, such as Si, Ge, or Sn.

The material of the first conductive semiconductor layer 11 is not limited to this, however, and the first conductive semiconductor layer 11 may be formed of (or may include) various other suitable materials.

The active layer 12 may be formed on the first conductive semiconductor layer 11 and may have a single- or multi-quantum well structure. In an embodiment of the present disclosure, a cladding layer doped with a conductive dopant may be formed on and/or under the active layer 12. For example, the cladding layer may be an AlGaN layer or an InAlGaN layer. In addition, a material, such as AlGaN or AlInGaN may be employed to form the active layer 12.

When an electric field having a reference voltage or more (e.g., a predetermined voltage or more) is applied to the opposite ends of the rod-type LED LD, the rod-type LED LD emits light by the coupling of electron-hole pairs in the active layer 12.

The second conductive semiconductor layer 13 may be provided on the active layer 12 and may include a semiconductor layer having a type different from that of the first conductive semiconductor layer 11. For example, the second conductive semiconductor layer 13 may include at least one p-type semiconductor layer. For instance, the second conductive semiconductor layer 13 may include a semiconductor layer including a semiconductor material of InAlGaN, GaN, AlGaN, InGaN, AlN, and InN and that is doped with a second conductive dopant such as Mg.

The material of the second conductive semiconductor layer 13 is not limited to this, however, and the second conductive semiconductor layer 13 may be formed of (or may include) various other suitable materials.

In an embodiment of the present disclosure, the rod-type LED LD may not only include the first conductive semiconductor layer 11, the active layer 12, and the second conductive semiconductor layer 13 but may also include a fluorescent layer, another active layer, another semiconductor layer, and/or an electrode layer provided on and/or under each layer.

Furthermore, the rod-type LED LD may further include an insulating film 14. In an embodiment of the present disclosure, the insulating film 14 may be omitted or may be provided to cover only some of (e.g., a portion of) the first conductive semiconductor layer 11, the active layer 12, and the second conductive semiconductor layer 13.

For example, the insulating film 14 may be provided on portions of the rod-type LED LD, other than the opposite ends of the rod-type LED LD so that the opposite ends of the rod-type LED LD are exposed.

Although FIG. 1 illustrates the insulating film 14 having a portion thereof removed, this is merely for convenience of explanation, and the actual rod-type LED LD may be formed such that the entirety of the side surface of the cylindrical body thereof (e.g., the entire peripheral surface thereof) is enclosed by the insulating film 14.

The insulating film 14 may be provided to enclose at least a portion of an outer circumferential surface of the first conductive semiconductor layer 11, the active layer 12, and/or the second conductive semiconductor layer 13. For example, the insulating film 14 may be provided to enclose at least the outer circumferential surface of the active layer 12.

In an embodiment of the present disclosure, the insulating film 14 may include a transparent insulating material. For example, the insulating film 14 may include an insulating material selected from the group consisting of $SiO_2$, $Si_3N_4$, $Al_2O_3$, and $TiO_2$, but it is not limited thereto. In other words, various suitable materials having insulating properties may be employed.

When the insulating film 14 is provided on the rod-type LED LD, the active layer 12 may not short-circuit with a first and/or second electrode.

Furthermore, the insulating film 14 may reduce or prevent the occurrence of a defect on the surface of the rod-type LED LD, thereby improving the lifetime and efficiency of the rod-type LED LD. Even when a plurality of rod-type LEDs LD is disposed adjacent to each other, the insulating film 14 may prevent the rod-type LEDs LD from undesirably short-circuiting between each other.

The above-described rod-type LED LD may be used as a light emitting source for various display devices. For example, the rod-type LED LD may be used in a lighting device or a self-light emissive display device.

Figure 2A:
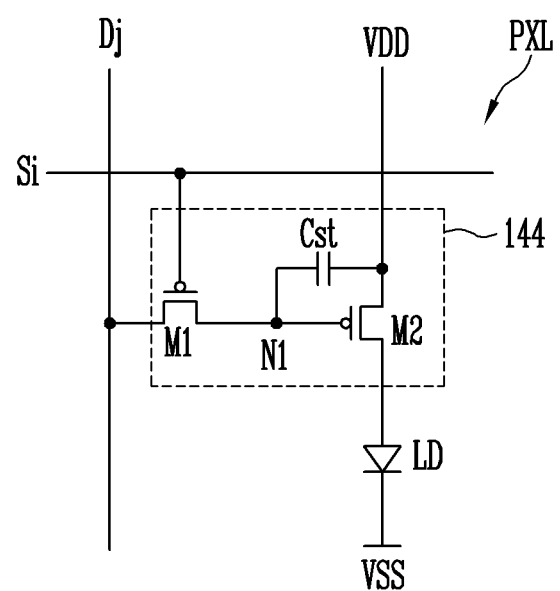
FIGS. 2a and 2b are circuit diagrams illustrating a unit light emission area of a light emitting device in accordance with an embodiment of the present disclosure.
Figure 2B:
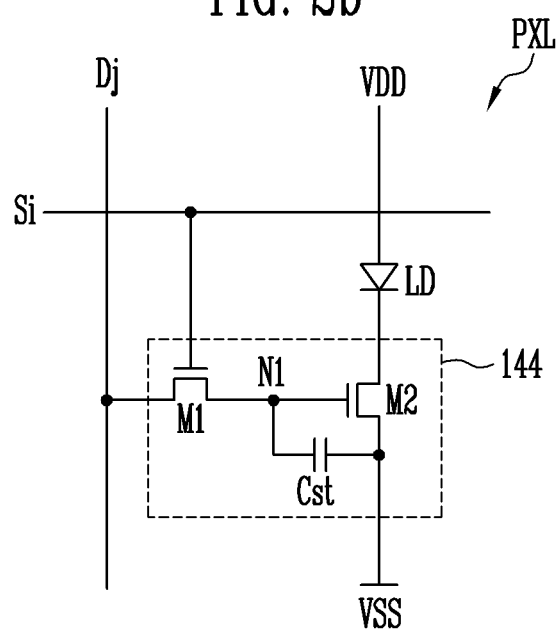

FIGS. 2a and 2b are circuit diagrams illustrating a unit light emission area of a light emitting device in accordance with embodiments of the present disclosure.

FIGS. 2a and 2b illustrate examples of a pixel of an active light emission display panel. In an embodiment of the present disclosure, the unit light emission area may be a pixel area in which a single pixel is provided.

Referring to FIG. 2a, a pixel PXL may include a rod-type LED LD and a driving circuit 144 that is coupled to the rod-type LED LD to drive the rod-type LED LD.

A first electrode (e.g., an anode electrode) of the rod-type LED LD may be coupled to a first driving power supply VDD via the driving circuit 144, and a second electrode (e.g., a cathode electrode) of the rod-type LED LD may be coupled to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the rod-type LED LD.

The rod-type LED LD may emit light having a luminance corresponding to driving current which is controlled by the driving circuit 144.

Although FIG. 2a illustrates an embodiment in which each of the pixels PXL include one rod-type LED LD, the present disclosure is not limited thereto. For example, the pixel PXL may include a plurality of rod-type LEDs LD coupled in parallel to each other.

In an embodiment of the present disclosure, the driving circuit 144 may include a first transistor M1, a second transistor M2, and a storage capacitor Cst. However, the structure of the driving circuit 144 is not limited to the embodiment illustrated in FIG. 2a.

The first transistor (e.g., a switching transistor) M1 includes a first electrode coupled to a data line, e.g., a j-th data line Dj, and a second electrode coupled to a first node N1, and a gate electrode coupled to a scan line Si. Here, the first electrode and the second electrode of the first transistor M1 may be different electrodes. For example, when the first electrode is a source electrode, the second electrode is a drain electrode.

When a scan signal having a voltage (e.g., a low-level voltage) capable of turning on the first transistor M1 is supplied from the scan line Si, the first transistor M1 is turned on to electrically couple the data line Dj with the first node N1. Here, a data signal of a corresponding frame is supplied to the data line Dj, and thereby, the data signal is transmitted to the first node N1. The data signal transmitted to the first node N1 is charged in the storage capacitor Cst.

The second transistor (e.g., a driving transistor) M2 includes a first electrode coupled to the first driving power supply VDD, a second electrode coupled to the first electrode of the rod-type LED LD, and a gate electrode coupled to the first node N1. The second transistor M2 may control the amount of driving current to be supplied to the rod-type LED LD in response to the voltage of the first node N1.

One electrode of the storage capacitor Cst is coupled to the first driving power supply VDD, and the other electrode thereof is coupled to the first node N1. The storage capacitor Cst may charge a voltage corresponding to the data signal supplied to the first node N1, and maintain the charged voltage until a data signal of a subsequent frame is supplied thereto.

For convenience sake, the driving circuit 144 illustrated in FIG. 2a has a relatively simple structure including the first transistor M1 configured to transmit the data signal to the pixel PXL, the storage capacitor Cst configured to store the data signal, and the second transistor M2 configured to supply driving current corresponding to the data signal to the rod-type LED LD.

However, the present disclosure is not limited to the foregoing structure, and the structure of the driving circuit 144 may be changed in various ways. For example, the driving circuit 144 may further include a transistor element, such as a transistor element configured to compensate for the threshold voltage of the second transistor M2, a transistor element configured to initialize the first node N1, a transistor element configured to control a light emission time of the rod-type LED LD, and/or other circuit elements, such as a boosting capacitor for boosting the voltage of the first node N1.

Furthermore, although the transistors (e.g., the first and second transistors M1 and M2) included in the driving circuit 144 are illustrated in FIG. 2a as being P-type transistors, the present disclosure is not limited thereto. For example, at least one of the first and second transistors M1 and M2 included in the driving circuit 144 may be an N-type transistor.

Referring to FIG. 2b, in an embodiment of the present disclosure, the first and second transistors M1 and M2 may be N-type transistors. The configuration and operation of the driving circuit 144 illustrated in FIG. 2b, other than a change in connection positions of some components due to a change in the transistor type, are similar to those of the driving circuit 144 of illustrated in FIG. 2a. Therefore, additional description of this embodiment will be omitted as redundant.

Figure 3:
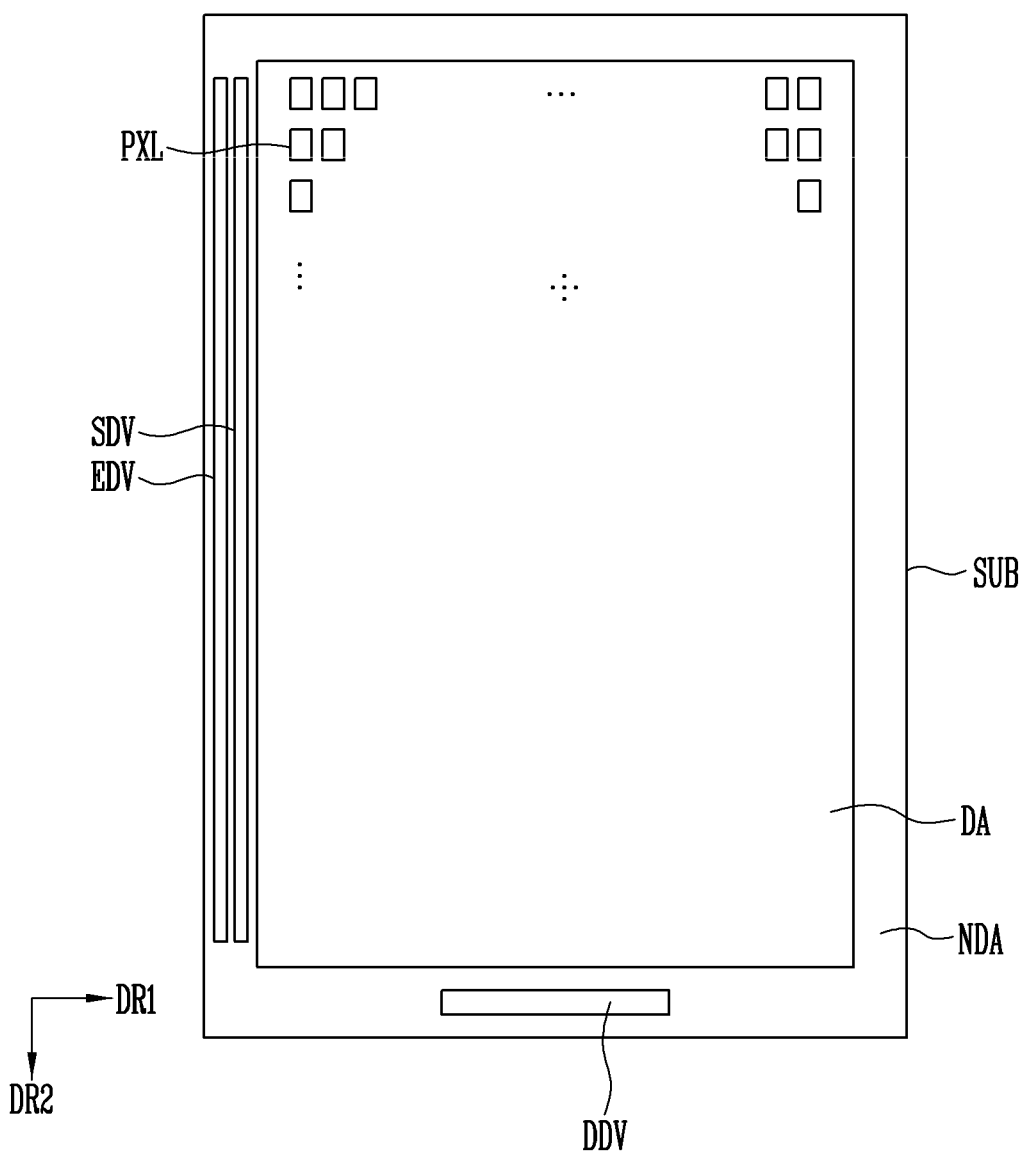
FIG. 3 is a schematic plan view illustrating a display device in accordance with an embodiment of the present disclosure.

FIG. 3 is a schematic plan view illustrating a display device in accordance with an embodiment of the present disclosure. The display device shown in FIG. 3 may use the light emitting device including the rod-type LED LD shown in, for example, FIG. 1 as a light emitting source.

Referring to FIGS. 1 to 3, the display device in accordance with the embodiment of the present disclosure may include a substrate SUB, pixels PXL which are provided on the substrate SUB, a driver which is provided on the substrate SUB and configured to drive the pixels PXL, and a line component, which couples the pixels PXL with the driver.

The substrate SUB may have a display area DA and a non-display area NDA.

The display area DA may be an area in which the pixels PXL for displaying an image are provided. The non-display area NDA may be an area in which the driver for driving the pixels PXL and a portion of the line component for coupling the pixels PXL to the driver are provided.

The display area DA may have various shapes. For example, the display area DA may be provided in various shapes, such as a closed polygon having linear sides, a circle, an ellipse, or the like having a curved-line side, or a semicircle, a semi-ellipse, or the like having a linear line sides and curved lines sides.

In an embodiment in which the display area DA has a plurality of areas, each area may have various forms, such as a closed polygon having linear sides, a semicircle, a semi-ellipse, or the like having a curved line sides. The surface areas of the plurality of areas may be the same as or different from each other.

In the illustrated embodiment, the display device has a single display area DA in a rectangular shape having linear sides.

The non-display area NDA may be provided on at least one side of the display area DA. In an embodiment of the present disclosure, the non-display area NDA may enclose the periphery of the display area DA.

The pixels PXL may be provided in the display area DA on the substrate SUB. Herein, pixel PXL refers to a smallest unit for displaying an image, and a plurality of pixels PXL may be provided.

Each of the pixels PXL may include a rod-type LED LD that emits white light and/or color light. Each pixel PXL may emit light having any one color from among red, green, and blue, but the pixels PXL are not limited thereto. For example, each of the pixels PXL may emit light having any one color from among cyan, magenta, yellow, and white.

The pixels PXL may be arranged in a matrix form along rows extending in a first direction DR1 and columns extending in a second direction DR2 crossing with the first direction DR1. However, the arrangement of the pixels PXL is not limited to a particular arrangement. In other words, the pixels PXL may be arranged in various forms.

The driver may provide a signal to each pixel PXL through the line component and, thus, may control the operation of the pixels PXL.

The driver may include a scan driver SDV configured to provide a scan signal to each of the pixels PXL through a scan line, an emission driver EDV configured to provide an emission control signal to each of the pixels PXL through an emission control line, a data driver DDV configured to provide a data signal to each of the pixels PXL through a data line, and a timing controller. The timing controller may control the scan driver SDV, the emission driver EDV, and the data driver DDV.

Figure 4:
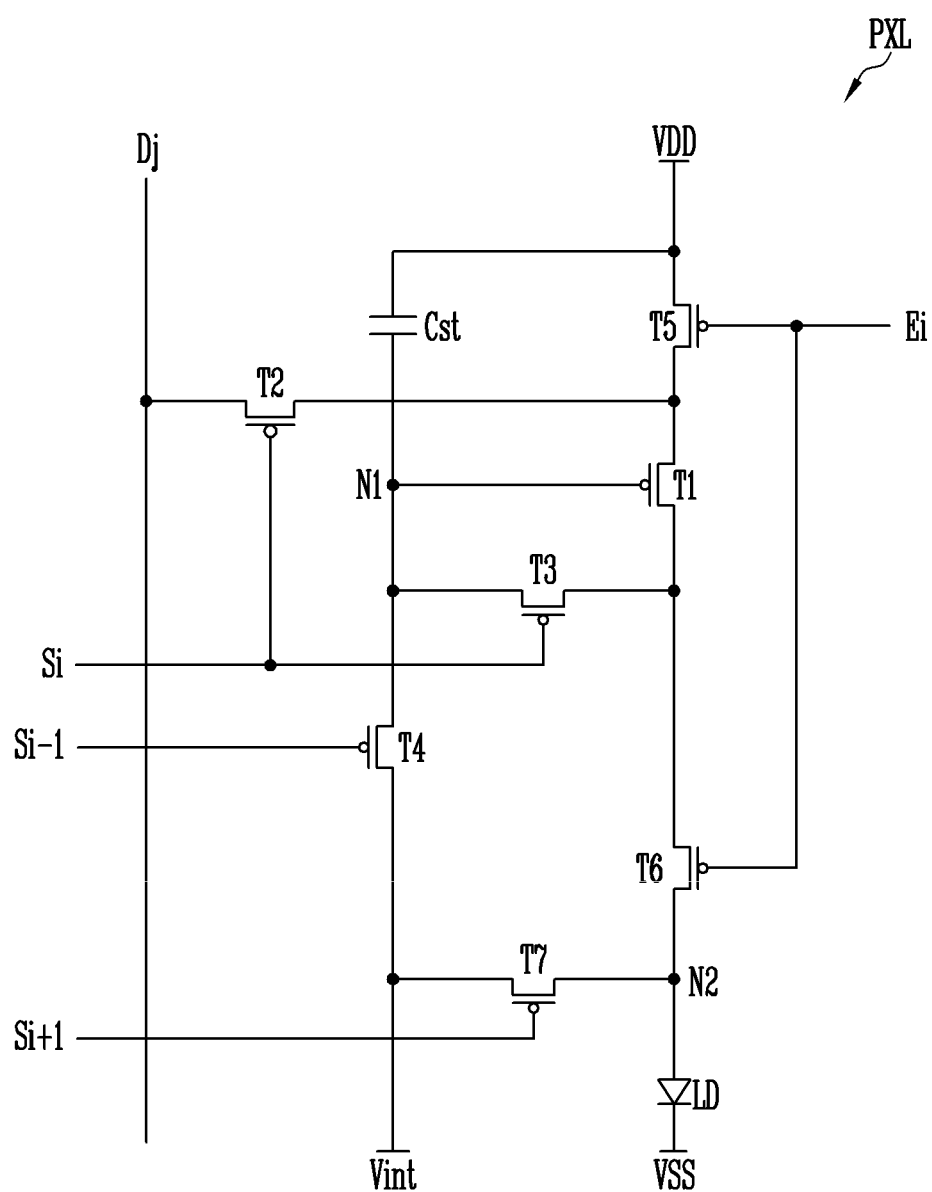
FIG. 4 is an equivalent circuit diagram illustrating a pixel as shown in FIG. 3.

FIG. 4 is an equivalent circuit diagram illustrating one of pixels shown in FIG. 3.

In FIG. 4, for convenience of explanation, is the pixel PXL illustrated as being coupled to a j-th data line Dj, an i−1-th scan line Si−1, an i-th scan line Si, and an i+1-th scan line Si+1.

Referring to FIGS. 3 and 4, the pixel PXL in accordance with an embodiment of the present disclosure may include a rod-type LED LD, first to seventh transistors T1 to T7, and a storage capacitor Cst.

The rod-type LED LD may have a first end coupled to the first transistor T1 via the sixth transistor T6 and a second end coupled to the second driving power supply VSS. The rod-type LED LD may emit light having a luminance corresponding to current supplied from the first transistor T1.

A source electrode of the first transistor (e.g., a driving transistor) T1 may be coupled to the first driving power supply VDD via the fifth transistor T5, and a drain electrode thereof may be coupled to the first end of the rod-type LED LD via the sixth transistor T6. The first transistor T1 controls, in response to the voltage at the first node N1, which is connected to a gate electrode of the first transistor T1, current flowing from the first driving power supply VDD to the second driving power supply VSS via the rod-type LED LD.

The second transistor (e.g., a switching transistor) T2 is coupled between the j-th data line Dj and the source electrode of the first transistor T1. A gate electrode of the second transistor T2 is coupled to the i-th scan line Si. When the scan signal is supplied to the i-th scan line Si, the second transistor T2 is turned on so that the source electrode of the first transistor T1 is electrically coupled with the j-th data line Dj.

The third transistor T3 is coupled between the drain electrode of the first transistor T1 and the first node N1. A gate electrode of the third transistor T3 is coupled to the i-th scan line Si. When a scan signal is supplied to the i-th scan line Si, the third transistor T3 is turned on so that the drain electrode of the first transistor T1 is electrically coupled with the first node N1. Therefore, when the third transistor T3 is turned on, the first transistor T1 may be connected in the form of a diode (e.g., may be diode-connected).

The fourth transistor T4 may be coupled between the first node N1 and an initialization power supply Vint. A gate electrode of the fourth transistor T4 is coupled to the i−1-th scan line Si−1. When a scan signal is supplied to the i−1-th scan line Si−1, the fourth transistor T4 is turned on so that the voltage of the initialization power supply Vint is supplied to the first node N1. The initialization power supply Vint may be a voltage lower than that of a data signal.

The fifth transistor T5 may be coupled between the first driving power supply VDD and the source electrode of the first transistor T1. A gate electrode of the fifth transistor T5 may be coupled to an i-th emission control line Ei. The fifth transistor T5 may be turned off when an emission control signal is supplied to the i-th emission control line Ei and may be turned on in the other cases.

The sixth transistor T6 is coupled between the drain electrode of the first transistor T1 and the first end of the rod-type LED LD. A gate electrode of the sixth transistor T6 may be coupled to the i-th emission control line Ei. The sixth transistor T6 may be turned off when an emission control signal is supplied to the i-th emission control line Ei and may be turned on in the other cases.

The seventh transistor T7 is coupled between the initialization power supply Vint and the first end of the rod-type LED LD. A gate electrode of the seventh transistor T7 is coupled to an i+1-th scan line Si+1. The seventh transistor T7 may be turned on when a scan signal is supplied to the i+1-th scan line Si+1 so that the voltage of the initialization power supply Vint may be supplied to the first end of the rod-type LED LD.

The storage capacitor Cst may be coupled between the first driving power supply VDD and the first node N1. The storage capacitor Cst may store a voltage corresponding to the data signal and a threshold voltage of the first transistor T1.

When the rod-type LED LD is arranged in one pixel PXL, a first alignment line is coupled to the second node N2, and a second alignment line is coupled to the second end of the rod-type LED LD.

A ground voltage (not shown) may be applied to the first alignment line, and an AC voltage may be applied to the second alignment line. As voltages (e.g., predetermined voltages) having different voltage levels are applied to the first and second alignment lines, respectively, an electric field may be generated between the second node N2 and the second end of the rod-type LED LD. The rod-type LED LD may be aligned in a desired area within the pixel PXL by the electric field.

Figure 5:
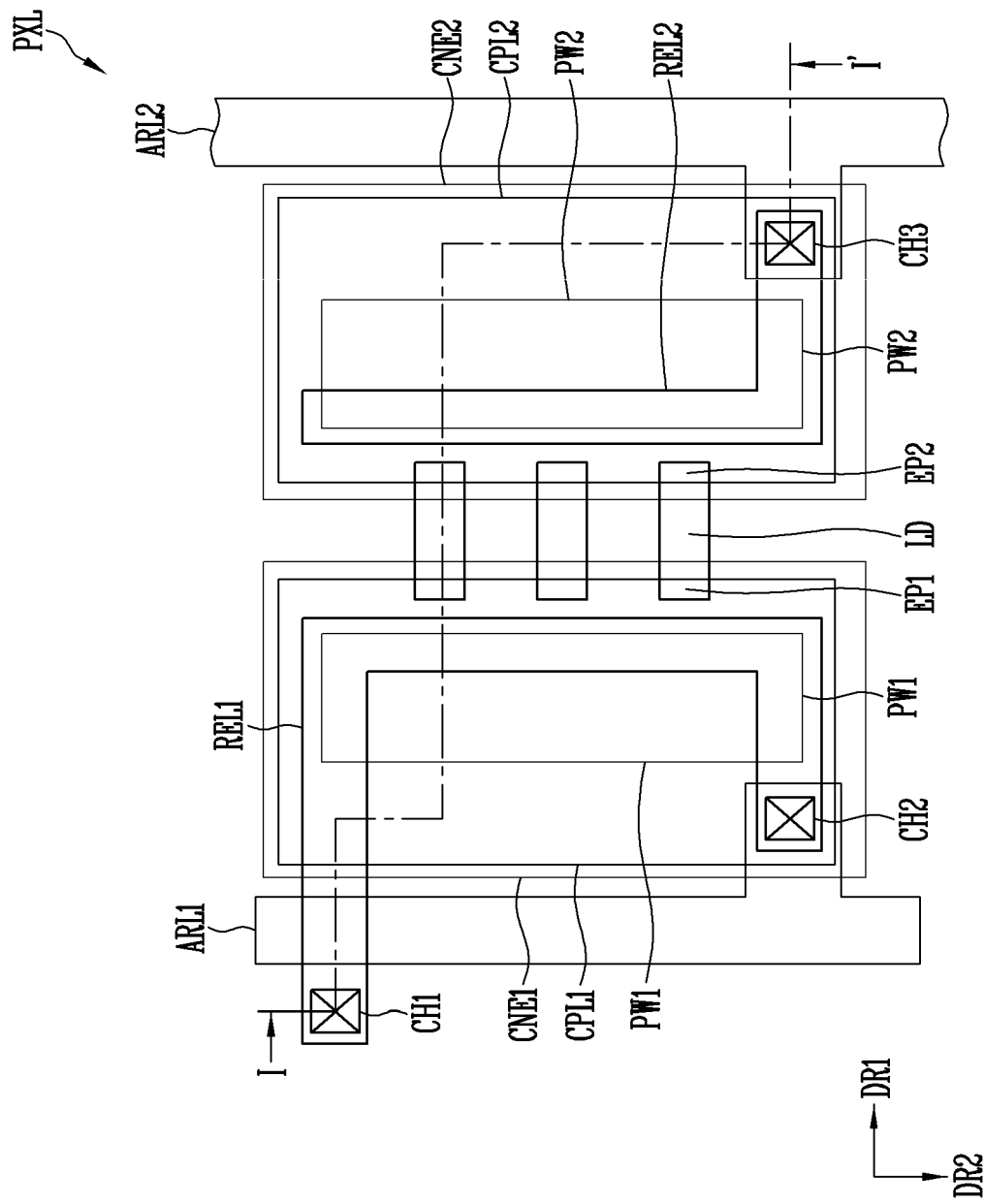
FIG. 5 is a plan view illustrating a unit light emission area of the light emitting device provided in one of the pixels as shown in FIG. 3.
Figure 6A:
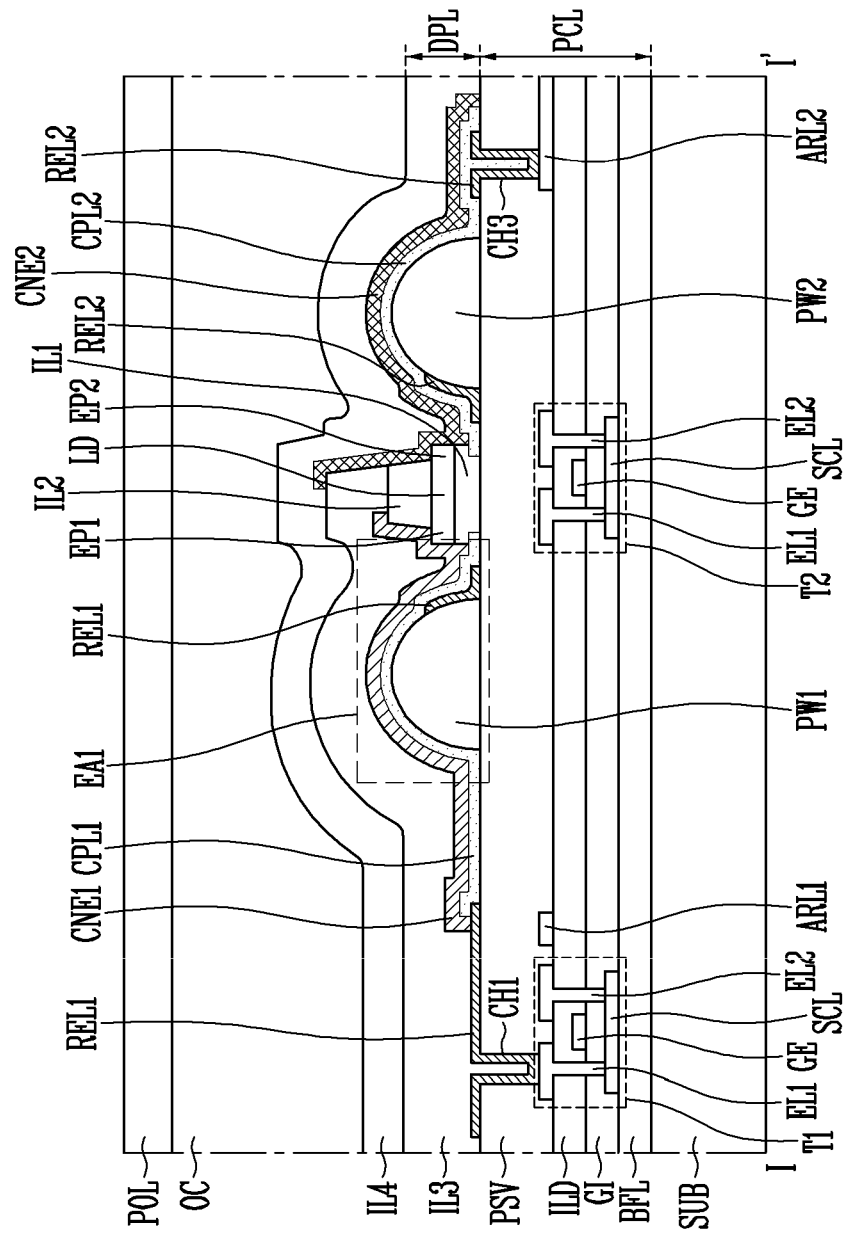
FIG. 6a is a sectional view taken along the line I-I' of FIG. 5.
Figure 6B:
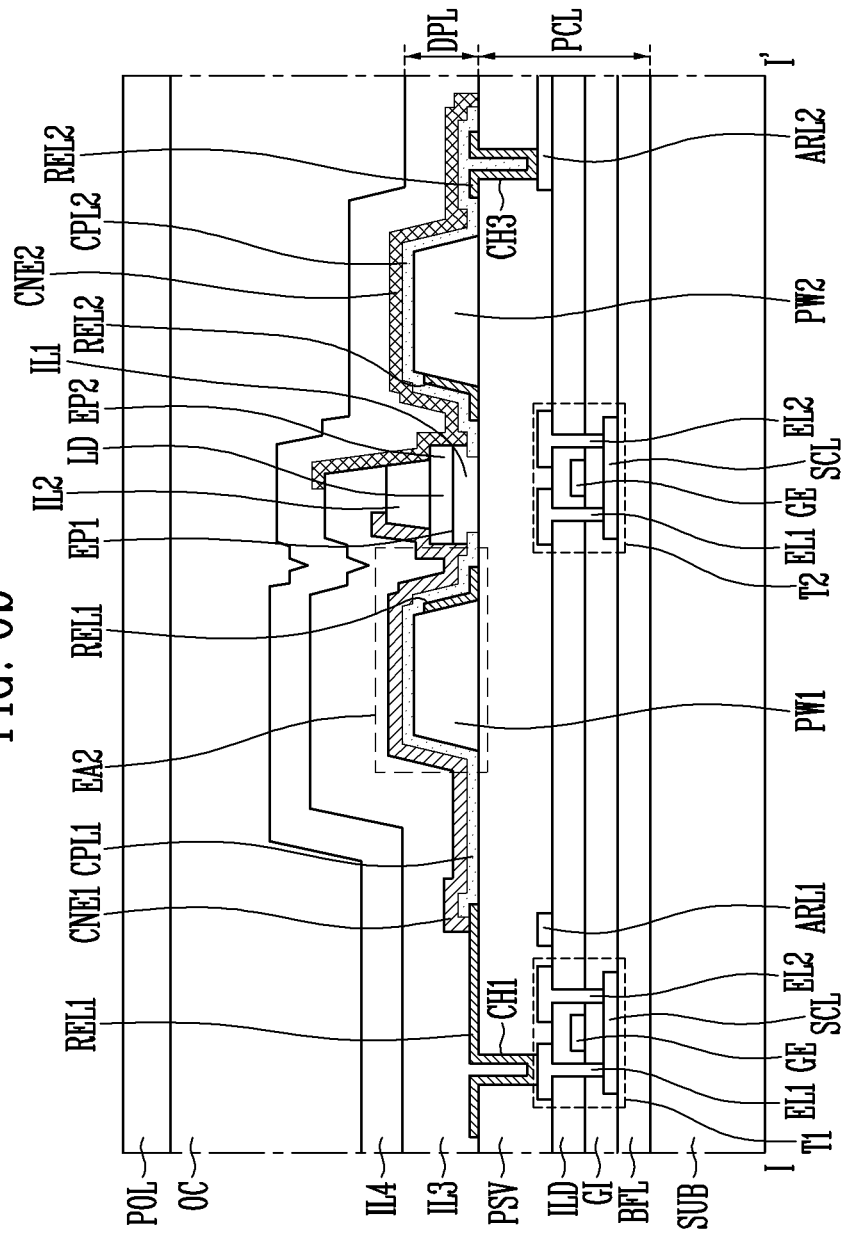
Figure 7A:
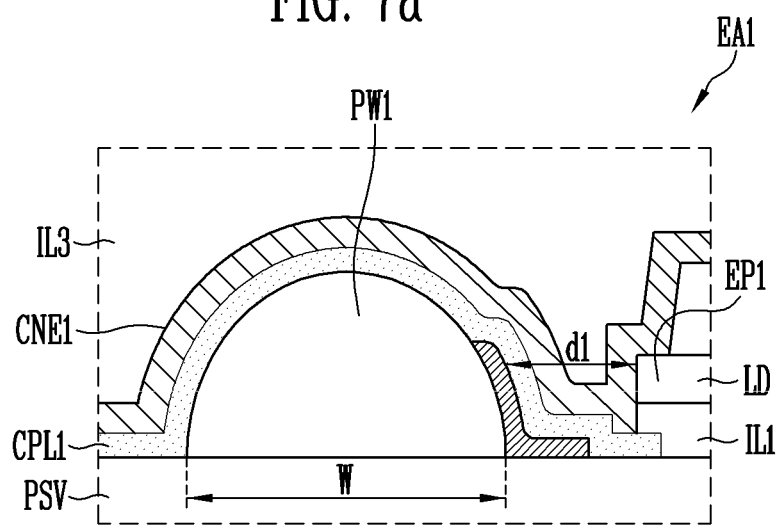
FIG. 7a is an enlarged sectional view of the area EA1 in FIG. 6a, and FIG. 7b is an enlarged sectional view of the area EA2 in FIG. 6b.
Figure 7B:
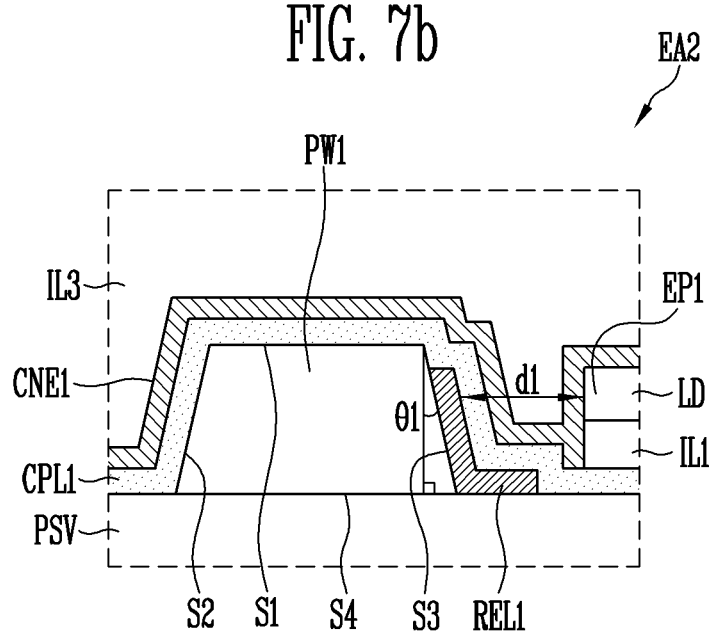
Figure 8A:
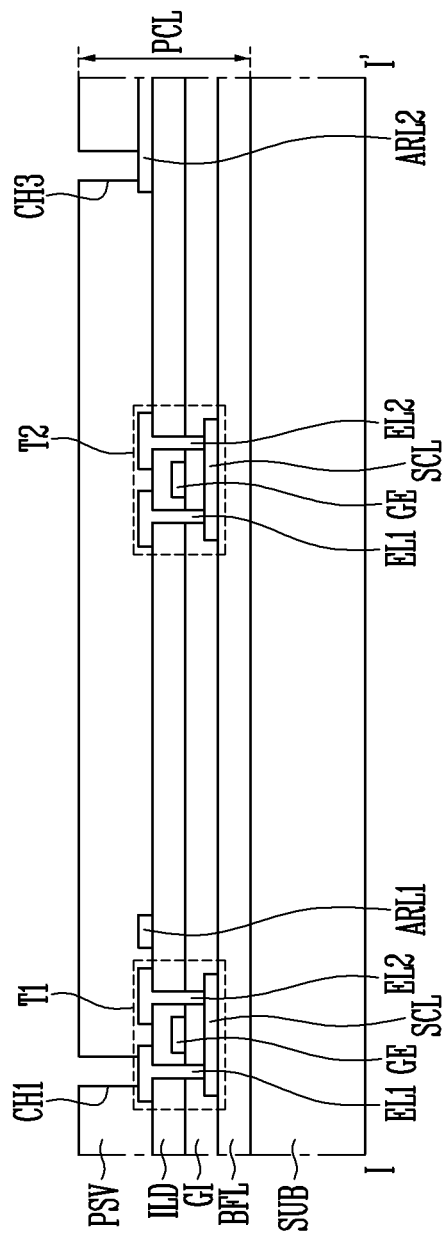
Figure 8B:
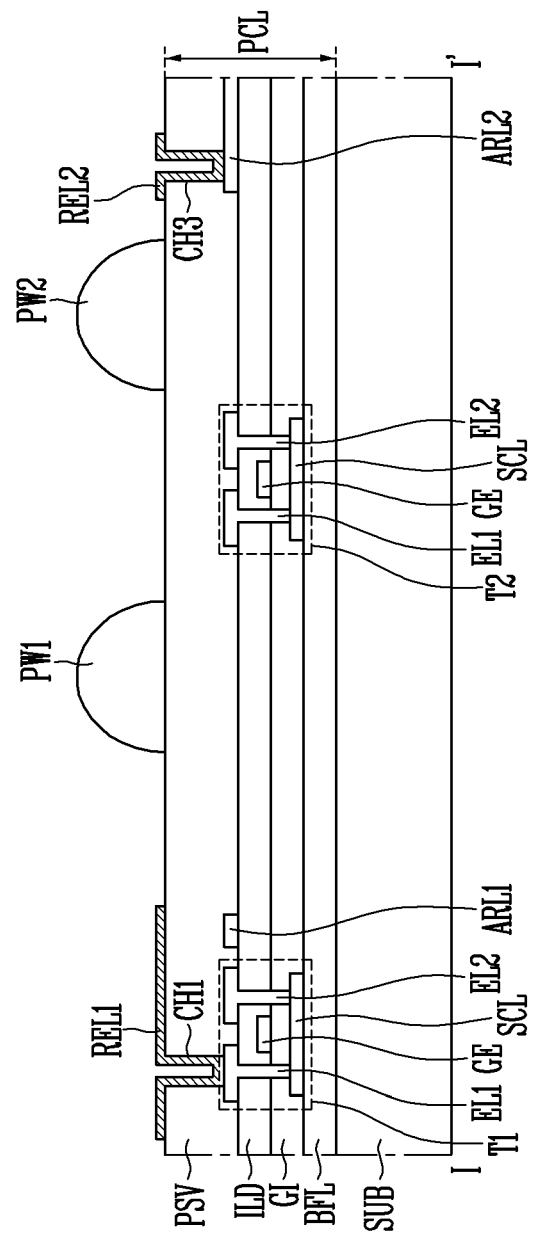
Figure 8C:
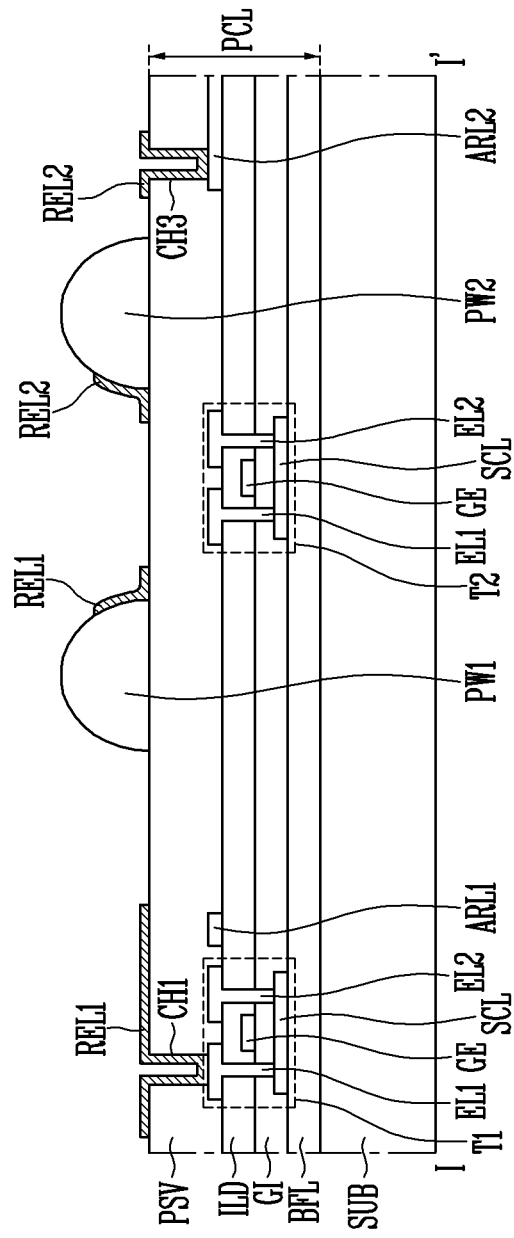
Figure 8E:
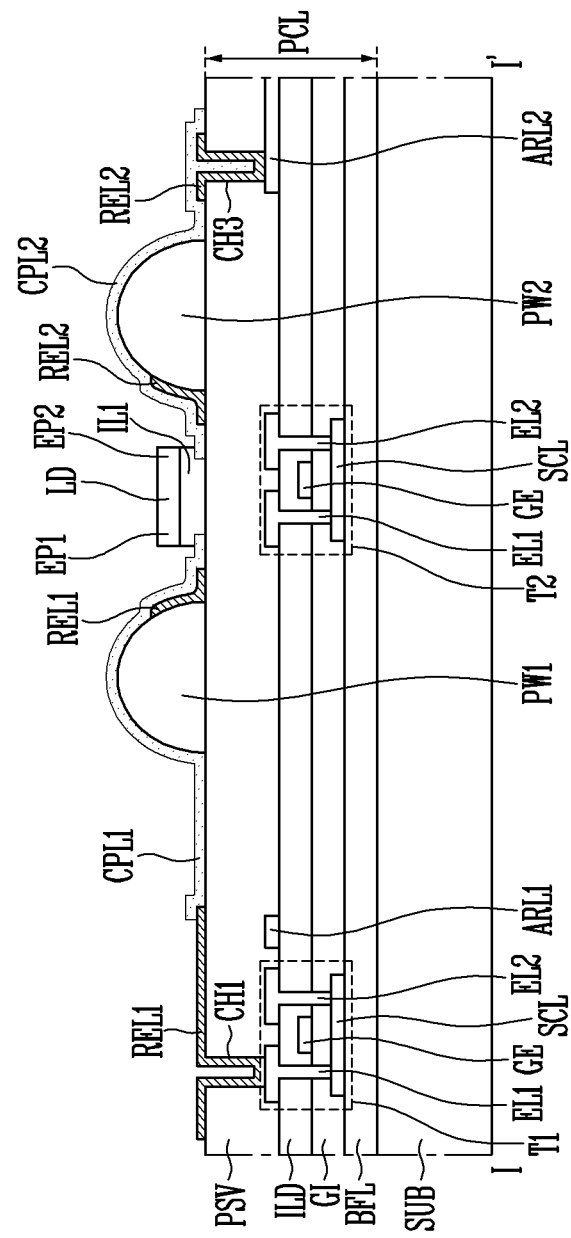
Figure 8F:
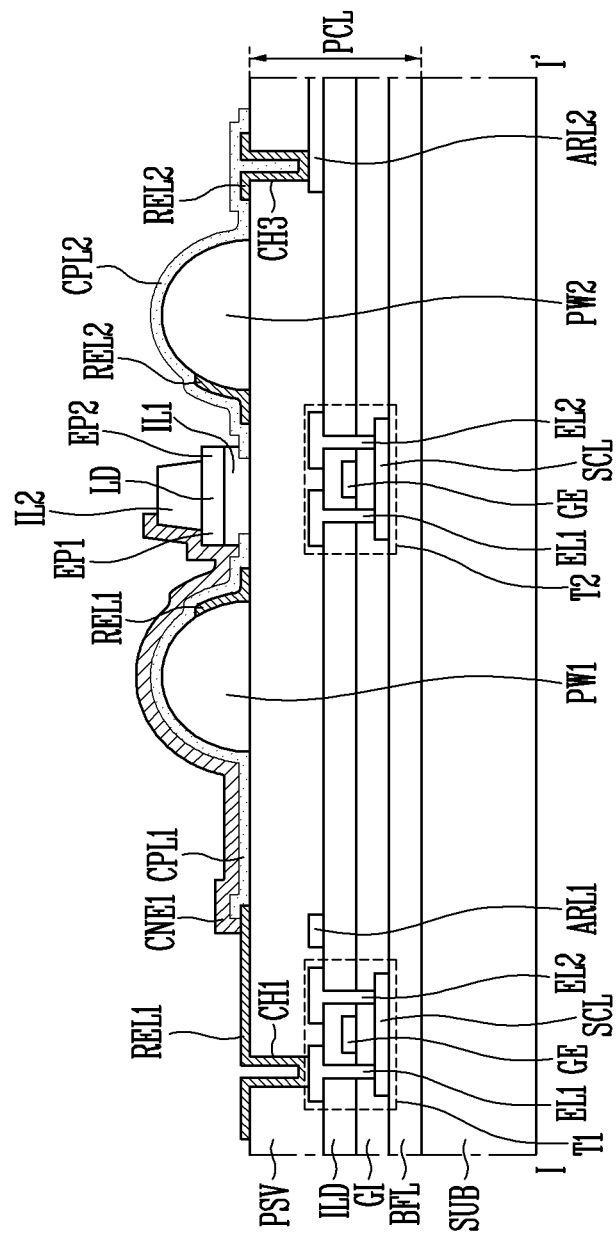
Figure 8G:
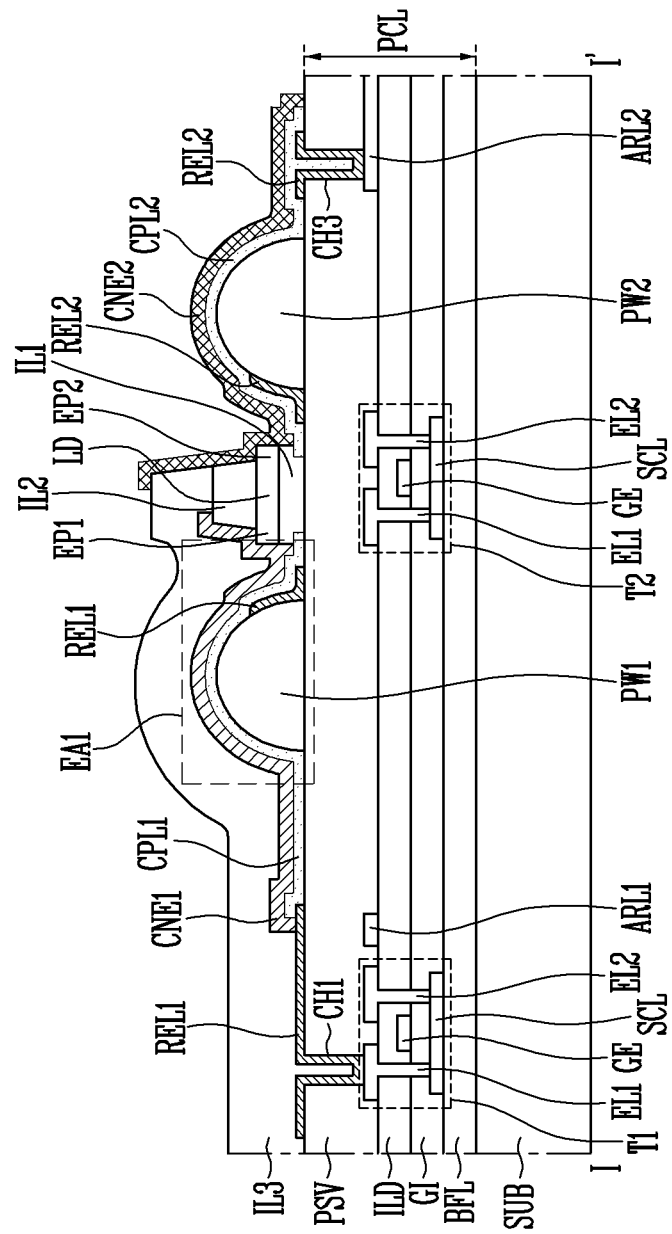
Figure 8H:
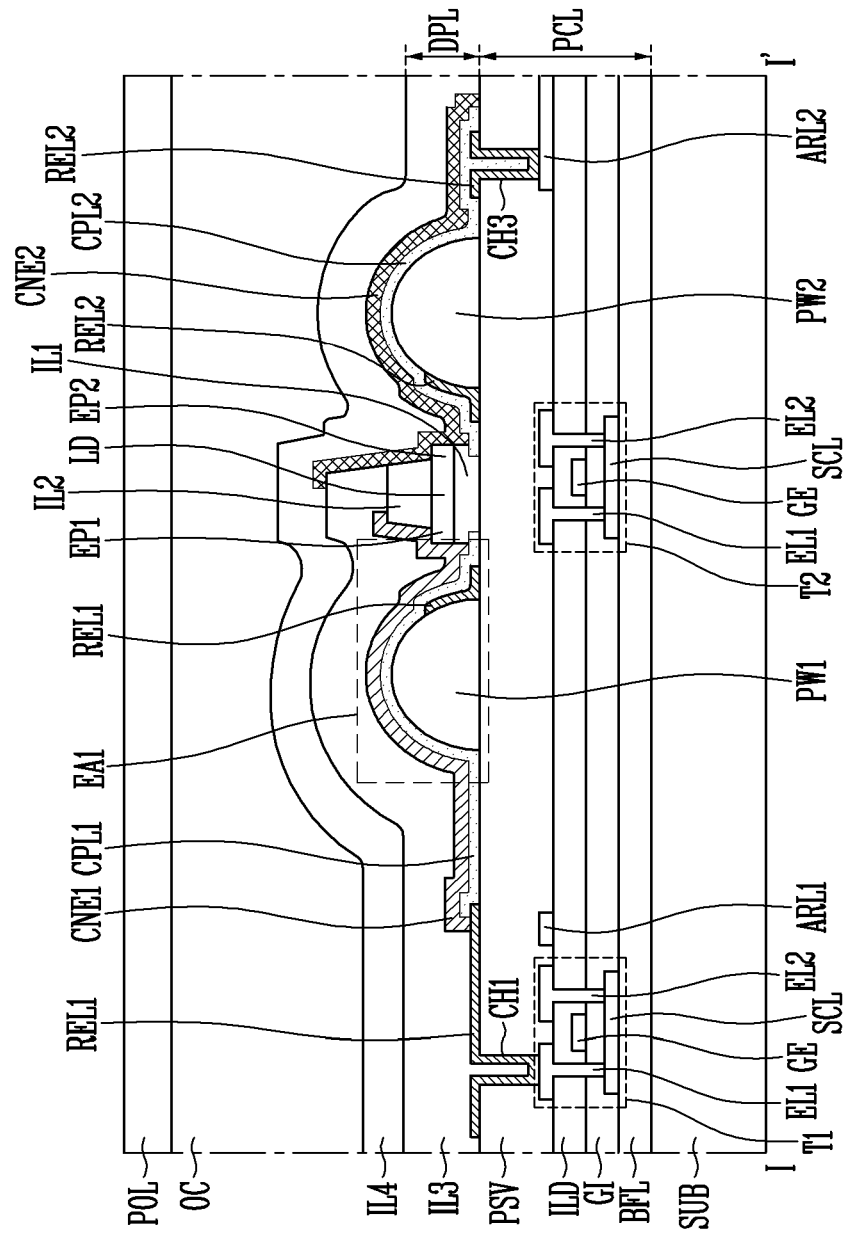

FIG. 5 is a plan view illustrating a unit light emission area of the light emitting device provided in one of the pixels PXL shown in FIG. 3, FIG. 6a is a sectional view taken along the line I-I' of FIG. 5, FIG. 6b is a sectional view corresponding to the line I-I' of FIG. 5 illustrating another embodiment of the light emitting device, FIG. 7a is an enlarged sectional view of the area EA1 of FIG. 6a, and FIG. 7b is an enlarged sectional view of the area EA2 of FIG. 6b.

Although FIG. 5 illustrates that a plurality of rod-type LEDs is arranged in a horizontal direction for the sake of convenience, the arrangement of the rod-type LEDs is not limited thereto. In FIG. 5, the unit light emission area may be a pixel area in which one pixel is provided.

Furthermore, for the sake of convenience, the transistors coupled to the rod-type LEDs and the signal lines coupled to the transistors are not shown in FIG. 5.

Referring to FIGS. 1 to 7b, the display device in accordance with an embodiment of the present disclosure may include a substrate SUB, a pixel circuit component PCL provided on the substrate SUB, and a display element layer DPL provided on the pixel circuit component PCL.

The substrate SUB may include an insulating material, such as glass, an organic polymer, or crystal. Furthermore, the substrate SUB may be made of a flexible material to be bendable or foldable and may have a single-layer or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB is not limited to these example and various suitable materials may be used.

The pixel circuit component PCL may include a buffer layer BFL disposed on the substrate SUB, first and second transistors T1 and T2 disposed on the buffer layer BFL, and first and second alignment lines ARL1 and ARL2.

The display element layer DPL may include first and second partition walls PW1 and PW2, a plurality of rod-type LEDs LD, first and second electrodes REL1 and REL2, and first and second contact electrodes CNE1 and CNE2.

For the convenience of explanation, the pixel circuit component PCL will be first described and then the display element layer DPL will be described.

The buffer layer BFL may prevent (or substantially prevent) impurities from being diffused into each of the first and second transistors T1 and T2. The buffer layer BFL may have a single-layer structure or a multi-layer structure including a plurality of layers.

When the buffer layer BFL has a multi-layer structure, the respective layers may be formed of the same material or different materials. In some embodiments, the buffer layer BFL may be omitted depending on the material of the substrate SUB or processing conditions.

The first transistor T1 may be a driving transistor that is electrically coupled to some of the rod-type LEDs LD to drive the rod-type LEDs LD. The second transistor T2 may be a switching transistor that switches the first transistor T1.

Each of the first and second transistors T1 and T2 may include a semiconductor layer SCL, a gate electrode GE, and first and second transistor electrodes EL1 and EL2.

The semiconductor layer SCL may be disposed on the buffer layer BFL. The semiconductor layer SCL may have a first area that contacts the first transistor electrode EL1, and a second area that contacts the second transistor electrode EL2. An area between the first area and the second area may be a channel area.

In an embodiment of the present disclosure, the first area may be any one of a source area and a drain area, and the second area may be the other area of the source area and the drain area.

The semiconductor layer SCL may be a semiconductor pattern formed of polysilicon, amorphous silicon, an oxide semiconductor, etc. The channel area may be a semiconductor pattern that is not doped with an impurity, that is, an intrinsic semiconductor. Each of the first and second areas may be a semiconductor pattern doped with an impurity.

The gate electrode GE may be provided on the semiconductor layer SCL with a gate insulating layer GI interposed therebetween.

The first transistor electrode EL1 and the second transistor electrode EL2 may respectively contact the first area and the second area of the semiconductor layer SCL through corresponding contact openings (e.g., contact holes), which pass through an interlayer insulating layer ILD and the gate insulating layer GI.

The first alignment line ARL1 may be provided on the interlayer insulating layer ILD and may be electrically coupled to the first electrode REL1 through a second contact opening (e.g., a second contact hole) CH2. A first alignment voltage may be applied to the first alignment line ARL1.

The first alignment line ARL1 may transmit the first alignment voltage to the first electrode REL1 to align the rod-type LEDs LD in the one pixel PXL.

The second alignment line ARL2 may be provided on the interlayer insulating layer ILD and may be electrically coupled to the second electrode REL2 through a third contact opening (e.g., a third contact hole) CH3. A second alignment voltage may be applied to the second alignment line ARL2.

The second alignment line ARL2 may transmit the second alignment voltage to the second electrode REL2 so as to align the rod-type LEDs LD in the one pixel PXL.

In an embodiment of the present disclosure, a ground voltage may be applied as the first alignment voltage to the first alignment line ARL1, and an AC voltage may be applied as the second alignment voltage to the second alignment line ARL2.

Because voltages (e.g., predetermined voltages) having different voltage levels are applied to the first alignment line ARL1 and the second alignment line ARL2, respectively, an electric field may be formed between the first electrode REL1 and the second electrode REL2.

The first and second alignment lines ARL1 and ARL2 may extend in the second direction DR2 in a plane view. In an embodiment of the present disclosure, the first alignment line ARL1 may be provided to correspond to only one pixel PXL (e.g., separate first alignment lines ARL1 may be provided in each pixel PXL). The second alignment line ARL2 may be provided to correspond to one pixel PXL as well as another pixel adjacent to the pixel PXL along the second direction DR2 (e.g., the second alignment line ARL2 may be provided in a plurality of adjacent pixels PXL).

In an embodiment of the present disclosure, after the rod-type LEDs LD are aligned in one pixel PXL, the second alignment line ARL2 may act as a driving voltage line that provides the second driving power supply VSS to a second end EP2 of each rod-type LED LD.

A passivation layer PSV may be provided on the first and second transistors T1 and T2 and the first and second alignment lines ARL1 and ARL2.

The passivation layer PSV may have a first contact opening (e.g., a first contact hole) CH1 that exposes a portion of the first transistor electrode EL1 of the first transistor T1 to an outside, and the second and third contact openings CH2 and CH3 may also be formed in the passivation layer PSV.

In an embodiment of the present disclosure, although the first and second alignment lines ARL1 and ARL2 are described as being provided in the pixel circuit component PCL, the present disclosure is not limited thereto.

For example, the first and second alignment lines ARL1 and ARL2 may be provided in the display element layer DPL. In such an embodiment, the first and second alignment lines ARL1 and ARL2 may be provided on the same layer as the first and second electrodes REL1 and REL2 and may include the same material as the first and second electrodes REL1 and REL2.

Each of the rod-type LEDs LD included in the display element layer DPL may include a first conductive semiconductor layer 11, a second conductive semiconductor layer 13, and an active layer 12 interposed between the first and second conductive semiconductor layers 11 and 13 (see, e.g., FIG. 1).

In an embodiment, the rod-type LEDs LD may further include an electrode layer provided on the second conductive semiconductor layer 13.

Furthermore, the electrode layer may include metal or a metal oxide for example, chrome (Cr), titanium (Ti), aluminum (Al), gold (Au), nickel (Ni), and an oxide or alloy thereof, and ITO (indium tin oxide) may be used alone or in combination with each other. However, the present disclosure is not limited thereto.

Each of the rod-type LEDs LD may have a first end EP1 and a second end EP2 in the longitudinal direction thereof.

One of the first and second conductive semiconductor layers 11 and 13 may be disposed at the first end EP1, and the other of the first and second conductive semiconductor layers 11 and 13 may be disposed at the second end EP2. Each of the rod-type LEDs LD may emit color light and/or white light.

The first and second ends EP1 and EP2 of each of the rod-type LEDs LD may be exposed to the outside by a second insulating layer IL2 that covers a portion of the upper surface of each of the rod-type LEDs LD. The second insulating layer IL2 may be formed of (or may include) an inorganic insulating layer including an inorganic material or an organic insulating layer including an organic material.

A first insulating layer IL1 may be disposed under each of the rod-type LEDs LD.

The first insulating layer IL1 may fill a space between each of the rod-type LEDs LD and the passivation layer PSV, stably support each of the rod-type LEDs LD, and prevent (or substantially prevent) the removal of (e.g., detaching of) each of the rod-type LEDs LD.

In an embodiment of the present disclosure, the first insulating layer IL1 may include an inorganic insulating layer including an inorganic material or an organic insulating layer including an organic material.

The first and second partition walls PW1 and PW2 may define the unit emission area in the one pixel PXL.

The first and second partition walls PW1 and PW2 may be provided on the passivation layer PSV and may be spaced apart from each other by a distance (e.g., by a predetermined distance). The first and second partition walls PW1 and PW2 may be provided on the passivation layer PSV to be spaced apart from each other by a distance that is equal to or greater than the length of one rod-type LED LD.

The first and second partition walls PW1 and PW2 may include insulating material including inorganic material or organic material, but the present disclosure is not limited thereto.

Each of the first and second partition walls PW1 and PW2 may have a curved section (e.g., a curved cross-section), such as a semi-circle or a semi-ellipse, which reduces in width in a direction from the bottom to the top (e.g., in a direction away from the passivation layer PSV), as illustrated in FIGS. 6a and 7a. However, the present disclosure is not limited thereto. A width W of the lower surface of each of the first and second partition walls PW1 and PW2, which contacts the passivation layer PSV, may be about 6 to 7 µm. However, the present disclosure is not limited thereto.

In an embodiment, each of the first and second partition walls PW1 and PW2 may have the shape of a trapezoid with a side that is inclined at an angle (e.g., a predetermined angle), as illustrated in FIGS. 6b and 7b. In this embodiment, each of the first and second partition walls PW1 and PW2 may have a lower surface S4 that contacts the passivation layer PSV, an upper surface S1 that faces the lower surface S4 and is narrower in width than the lower surface S4, and first and second side surfaces S2 and S3 that are coupled to (e.g., extend between) the lower surface S4 and the upper surface S1, as illustrated in FIG. 7b. Thus, each of the first and second partition walls PW1 and PW2 may have a trapezoidal section (e.g., a trapezoidal cross-section).

Here, the second side surface S3 may be adjacent to one of the opposite ends EP1 and EP2 of each of the rod-type LEDs LD, while the first side surface S2 may face the second side surface S3. The second side surface S3 may extend from one end of the upper surface S1 at an inclination (e.g., a predetermined inclination) θ1 based on a normal that is perpendicular to the lower surface S4 (e.g., based on a line that is normal to the lower surface S4). The inclination θ1 may be less than 90°. Thus, the second side surface S3 may be inclined. The first side surface S2 may be inclined at the same or substantially the same inclination as that of the second side surface S3.

The cross-section of each of the first and second partition walls PW1 and PW2 may have various shapes, such as a circle, a rectangle, a triangle, or a polygon, without being limited to the above-described embodiments.

The first and second partition walls PW1 and PW2 may be arranged on the same plane on the passivation layer PSV and may have the same (or substantially the same) height.

The first electrode REL1 may be disposed on the side surface of the first partition wall PW1 and the passivation layer PSV. Furthermore, the second electrode REL2 may be disposed on the side surface of the second partition wall PW2 and the passivation layer PSV.

For the convenience of explanation, the first electrode REL1 disposed on the side surface of the first partition wall PW1 will be referred to as a 1-1-th electrode REL1, while the second electrode REL2 disposed on the side surface of the second partition wall PW2 will be referred to as a 2-1-th electrode REL2.

When viewed on the plane, the 1-1-th electrode REL1 may partially overlap the first partition wall PW1, and the 2-1-th electrode REL2 may partially overlap the second partition wall PW2.

The 1-1-th and 2-1-th electrodes REL1 and REL2 may correspond to the shape of the first and second partition walls PW1 and PW2.

Thus, when the first partition wall PW1 has a trapezoidal cross-section, the 1-1-th electrode REL1 may be inclined to correspond to the inclination θ1 of the second side surface S3 of the first partition wall PW1. Furthermore, when the first partition wall PW1 has a semi-circular or semi-elliptical cross-section, the 1-1-th electrode REL1 may have a curvature corresponding to the curved surface of the first partition wall PW1.

Likewise, when the second partition wall PW2 has a trapezoidal cross-section, the 2-1-th electrode REL2 may be inclined to correspond to the inclination of the second side surface S3 of the second partition wall PW2. Furthermore, when the second partition wall PW2 has a semi-circular or semi-elliptical cross-section, the 2-1-th electrode REL2 may have a curvature corresponding to the curved surface of the second partition wall PW2.

In an embodiment of the present disclosure, the 1-1-th and 2-1-th electrodes REL1 and REL2 may cause light emitted from the opposite ends EP1 and EP2 of the rod-type LED LD to proceed in a direction in which an image is displayed (e.g., afront direction).

For example, because the 1-1-th and 2-1-th electrodes REL1 and REL2 have a shape corresponding to the first and second partition walls PW1 and PW2, light emitted from the opposite ends EP1 and EP2 of each of the rod-type LEDs LD may be reflected by the 1-1-th and 2-1-th electrodes REL1 and REL2 to further proceed in the front direction. Therefore, the efficiency of light emitted from each of the rod-type LEDs LD (e.g., the light emission efficiency) may be improved.

As a distance d1 between the 1-1-th electrode REL1 and the first end EP1 of each of the rod-type LEDs LD is reduced, light emitted from the first end EP1 of each of the rod-type LEDs LD may proceed to the 1-1-th electrode REL1 with less loss. Thus, the efficiency of light emitted from the first end EP1 of each of the rod-type LEDs LD may be improved by reducing the distance d1.

Likewise, as a distance between the 2-1-th electrode REL2 and the second end EP2 of each of the rod-type LEDs LD is reduced, light emitted from the second end EP2 of each of the rod-type LEDs LD may proceed to the 2-1-th electrode REL2 with less loss.

In an embodiment of the present disclosure, the first and second partition walls PW1 and PW2 may act as reflective members that improve the efficiency of light emitted from each of the rod-type LEDs LD along with the 1-1-th and 2-1-th electrodes REL1 and REL2.

Any one of the 1-1-th and 2-1-th electrodes REL1 and REL2 may be an anode electrode, and the other may be a cathode electrode. In an embodiment of the present disclosure, the 1-1-th electrode REL1 may be an anode electrode, and the 2-1-th electrode REL2 may be a cathode electrode.

The 1-1-th electrode REL1 and the 2-1-th electrode REL2 may be disposed on the same plane and may have the same (or substantially the same) height.

The first electrode REL1 provided on the passivation layer PSV (hereinafter referred to as a "1-2-th electrode") may be electrically coupled to the first alignment line ARL1 through the second contact opening CH2 that is formed through the passivation layer PSV. When the rod-type LEDs LD are aligned in the one pixel PXL, the first alignment voltage of the first alignment line ARL1 may be applied to the 1-2-th electrode REL1 through the second contact opening CH2.

Furthermore, the 1-2-th electrode REL1 may be electrically coupled to the first transistor electrode EL1 of the first transistor T1 through the first contact opening CH1 that is formed through the passivation layer PSV. When the rod-type LEDs LD are driven, a signal provided to the first transistor T1 may be transmitted to the 1-2-th electrode REL1 through the first contact opening CH1.

The second electrode REL2 provided on the passivation layer PSV (hereinafter referred to as a "2-2-th electrode") may be electrically coupled to the second alignment line ARL2 through the third contact opening CH3 that is formed through the passivation layer PSV. Thus, when the rod-type LEDs LD are aligned in the one pixel PXL, the second alignment voltage of the second alignment line ARL2 may be applied to the 2-2-th electrode REL2 through the third contact opening CH3.

In an embodiment of the present disclosure, when the rod-type LEDs LD are driven, the second driving power supply VSS may be applied to the second alignment line ARL2. Thus, when the rod-type LEDs LD are driven, the second driving power supply VSS of the second alignment line ARL2 may be transmitted to the 2-2-th electrode REL2 through the third contact opening CH3.

The 1-1-th and 1-2-th electrodes REL1 and the 2-1-th and 2-2-th electrodes REL2 may be made of a reflective conductive material (e.g., a conductive material having a predetermined reflectivity). The conductive material may include metal such as Ag, Mg, Al, Pt, Pd, Au, Ni, Nd, Ir, Cr, Ti, or an alloy thereof, a conductive oxide such as indium tin oxide (ITO), indium zinc oxide (IZO), zinc oxide (ZnO), or indium tin zinc oxide (ITZO), and a conductive polymer, such as PEDOT.

Furthermore, the 1-1-th and 1-2-th electrodes REL1 and the 2-1-th and 2-2-th electrodes REL2 may have a single-layered structure. However, without being limited thereto, the 1-1-th and 1-2-th electrodes REL1 and the 2-1-th and 2-2-th electrodes REL2 may have a multi-layered structure formed by stacking a plurality of materials from among metals, alloys, conductive oxides, and conductive polymers.

For example, the 1-1-th and 1-2-th electrodes REL1 and the 2-1-th and 2-2-th electrodes REL2 may have the multi-layered structure to reduce or minimize voltage drop due to a signal delay when the signal is transmitted to the opposite ends EP1 and EP2 of each of the rod-type LEDs LD. In this embodiment, the 1-1-th and 1-2-th electrodes REL1 and the 2-1-th and 2-2-th electrodes REL2 may have a multi-layered structure in which ITO, Ag, and ITO are stacked in this order or Ti, Al, and Ti are stacked in this order. However, the present disclosure is not limited thereto.

The materials of the 1-1-th and 1-2-th electrodes REL1 and the 2-1-th and 2-2-th electrodes REL2 are not limited to the above-described materials. For example, the 1-1-th and 1-2-th electrodes REL1 and the 2-1-th and 2-2-th electrodes REL2 may be formed of a reflective material to cause light emitted from the opposite ends EP1 and EP2 of each of the rod-type LEDs LD to proceed in a direction in which the image is displayed (e.g., the front direction).

A first encapsulation layer CPL1 may be provided on the 1-1-th and 1-2-th electrodes REL1. The first encapsulation layer CPL1 may reduce or prevent damage to the 1-1-th and 1-2-th electrodes REL1 due to defects occurring during the manufacturing process of the display device, and may further enhance adhesion between the 1-1-th and 1-2-th electrodes REL1 and the pixel circuit component PCL.

The first encapsulation layer CPL1 may include (or may be made of) a transparent conductive material, such as IZO, to reduce or minimize the loss of light that is emitted from the first end EP1 of each of the rod-type LEDs LD and then is reflected in the front direction by the 1-1-th and 1-2-th electrodes REL1.

When viewed on the plane, the first encapsulation layer CPL1 may overlap the 1-1-th and 1-2-th electrodes REL1 and the first partition wall PW1.

The first contact electrode CNE1, which reliably electrically and/or physically couples the 1-1-th electrode REL1 with the first end EP1 of each of the rod-type LEDs LD, may be provided on the first encapsulation layer CPL1.

The first contact electrode CNE1 may include (or may be formed of) a transparent conductive material. For example, the transparent conductive material may include ITO, IZO, ITZO, etc. The first contact electrode CNE1 is not limited to the above-described materials, however.

When viewed on the plane, the first contact electrode CNE1 may overlap (e.g., may partially or completely cover) the 1-1-th and 1-2-th electrodes REL1. Furthermore, the first contact electrode CNE1 may partially overlap the first end EP1 of each of the rod-type LEDs LD.

In an embodiment, when the first encapsulation layer CPL1 is omitted, the first contact electrode CNE1 may be directly provided on the 1-1-th and 1-2-th electrodes REL1 to be directly coupled to the 1-1-th and 1-2-th electrodes REL1.

A third insulating layer IL3 may be provided on the first contact electrode CNE1 to cover the first contact electrode CNE1. The third insulating layer IL3 may prevent (or substantially prevent) the first contact electrode CNE1 from being exposed to the outside, thus preventing or reducing the occurrence of the first contact electrode CNE1 from being corroded.

The third insulating layer IL3 may include (or may be formed of) an inorganic insulating layer including inorganic material, or an organic insulating layer including organic material. Although the third insulating layer IL3 may have a single-layer structure as illustrated, the present disclosure is not limited thereto. For example, the third insulating layer IL3 may have a multi-layer structure.

A second encapsulation layer CPL2 may be provided on the second electrode REL2. The second encapsulation layer CPL2 may prevent or reduce damage to the 2-1-th and 2-2-th electrodes REL2 due to defects occurring during the manufacturing process of the display device and may further enhance adhesion between the 2-1-th and 2-2-th electrodes REL2 and the pixel circuit component PCL.

The second encapsulation layer CPL2 may be provided on the same layer as that of the first encapsulation layer CPL1 and may include the same material as that of the first encapsulation layer CPL1. When viewed on the plane, the second encapsulation layer CPL2 may overlap the 2-1-th and 2-2-th electrodes REL2 and the second partition wall PW2.

The second contact electrode CNE2 may be provided on the second encapsulation layer CPL2. When viewed on the plane, the second contact electrode CNE2 may overlap and cover (e.g., partially or completely cover) the 2-1-th and 2-2-th electrodes REL2. Furthermore, the second contact electrode CNE2 may overlap the second end EP2 of each of the rod-type LEDs LD.

The second contact electrode CNE2 may include (or may be made of) the same material as that of the first contact electrode CNE1, but it is not limited thereto.

In an embodiment, when the second encapsulation layer CPL2 is omitted, the second contact electrode CNE2 may be directly provided on the 2-1-th and 2-2-th electrodes REL2 to be directly coupled to the 2-1-th and 2-2-th electrodes REL2.

A fourth insulating layer IL4 may be provided on the second contact electrode CNE2 to cover the second contact electrode CNE2.

The fourth insulating layer IL4 may prevent (or substantially prevent) the second contact electrode CNE2 from being exposed to the outside, thus, preventing or substantially preventing the second contact electrode CNE2 from being corroded. The fourth insulating layer IL4 may be either an inorganic insulating layer or an organic insulating layer.

An overcoat layer OC may be provided on the fourth insulating layer IL4.

The overcoat layer OC may be a planarization layer for planarizing a stepped structure formed by components provided (e.g., formed) under the overcoat layer OC. In addition, the overcoat layer OC may act as an encapsulation layer for preventing (or substantially preventing) oxygen or water from penetrating into (or reaching) the rod-type LEDs LD.

In an embodiment, the overcoat layer OC may be omitted. When the overcoat layer OC is omitted, the fourth insulating layer IL4 may act as an encapsulation layer that prevents (or substantially prevents) oxygen or water from penetrating into (or reaching) the rod-type LEDs LD.

A polarizing film POL may be provided on the overcoat layer OC.

The polarizing film POL may have a polarizing axis and may linearly polarize light in a direction perpendicular to the polarizing axis. For example, the polarizing film POL may absorb rays of light that are aligned with the polarization axis and allow rays of light that are perpendicular to the polarization axis to pass therethrough. Thus, when the light passes through the polarizing film POL, the light may be linearly polarized in a direction perpendicular to the polarization axis.

The polarizing film POL may absorb light aligned with the polarization axis from among light that is introduced into (e.g., incident to) the display device from an external device, reflected by the display device, and then emitted, thereby reducing the reflectance of the external light of the display device.

As described above, the first end EP1 of each of the rod-type LEDs LD may be coupled to the 1-1-th electrode REL1, and the second end EP2 of each of the rod-type LEDs LD may be coupled to the 2-1-th electrode REL2. For example, the first conductive semiconductor layer 11 of each of the rod-type LEDs LD may be coupled to the 1-1-th electrode REL1, and the second conductive semiconductor layer 13 of each of the rod-type LEDs LD may be coupled to the 2-1-th electrode REL2.

Thus, the first and second conductive semiconductor layers 11 and 13 of each of the rod-type LEDs LD may receive a voltage (e.g., a predetermined voltage) through the 1-1-th electrode REL1 and the 2-1-th electrode REL2.

When an electric field of a reference voltage (e.g., predetermined voltage) or more is applied to the opposite ends EP1 and EP2 of each of the rod-type LEDs LD, each of the rod-type LEDs LD emits light due to the coupling of electron-hole pairs in the active layer 12.

The light emitted from the first end EP1 of each of the rod-type LEDs LD may proceed to the 1-1-th electrode REL1 facing the first end EP1. The light incident to the 1-1-th electrode REL1 may be reflected by the 1-1-th electrode REL1 in the front direction to proceed toward the third and fourth insulating layers IL3 and IL4.

In an embodiment of the present disclosure, to improve the light output efficiency of light reflected in the front direction by the 1-1-th electrode REL1 (hereinafter, referred to as a "first reflected light"), the third and fourth insulating layers IL3 and IL4 may be insulating layers having the same (or substantially the same) refractive index as that of the 1-1-th electrode REL1.

If the third and fourth insulating layers IL3 and IL4 each have a refractive index smaller than that of the 1-1-th electrode REL1, a portion of the first reflected light may be absorbed by the third and fourth insulating layers IL3 and IL4 by total reflection conditions. Thus, the light output efficiency of the first reflected light may be deteriorated.

Thus, in an embodiment of the present disclosure, the refractive index of each of the third and fourth insulating layers IL3 and IL4 may be set to be equal to (or substantially equal to) that of the 1-1-th electrode REL1, thus, improving the light output efficiency of the first reflected light without (or without substantial) light loss.

The light emitted from the second end EP2 of each of the rod-type LEDs LD may proceed to the 2-1-th electrode REL2 facing the second end EP2. The light incident to the 2-1-th electrode REL2 may be reflected by the 2-1-th electrode REL2 in the front direction.

The light reflected in the front direction by the 2-1-th electrode REL2 (hereinafter, referred to as a "second reflected light") may proceed toward the third and fourth insulating layers IL3 and IL4.

When the third and fourth insulating layers IL3 and IL4 have the same (or substantially the same) refractive index as that of the 2-1-th electrode REL2, the second reflected light may pass through the third and fourth insulating layers IL3 and IL4 without (or without substantial) loss. Thus, the light output efficiency of the second reflected light may be improved.

In an embodiment of the present disclosure, to improve the light output efficiency of each of the first reflected light and the second reflected light passing through the fourth insulating layer IL4, the overcoat layer OC provided on the fourth insulating layer IL4 may include (or may be formed of) an organic insulating layer having the same refractive index as that of the fourth insulating layer IL4.

As described above, in the display device according to an embodiment of the present disclosure, each of the 1-1-th and 2-1-th electrodes REL1 and REL2 may be disposed to overlap a portion of the corresponding partition wall PW1, PW2 when viewed on the plane.

For example, the 1-1-th and 2-1-th electrodes REL1 and REL2 may be provided only in a specific area in the display device. In some embodiments, the 1-1-th electrode REL1 may be disposed only on a side surface of the first partition wall PW1, and the 2-1-th electrode REL2 may be disposed only on a side surface of the second partition wall PW2.

In such an embodiment, from among external light incident onto the display device, the light proceeding to the upper surface of the corresponding partition wall may be absorbed by the third and fourth insulating layers IL3 and IL4 and the overcoat layer OC due to the absence of the 1-1-th and 2-1-th electrodes REL1 and REL2.

Thus, the display device in accordance with an embodiment of the present disclosure can minimize poor visibility caused by the external light.

In a conventional display device, the 1-1-th and 2-1-th electrodes REL1 and REL2 completely cover the corresponding partition wall. Thus, an area occupied by the 1-1-th and 2-1-th electrodes REL1 and REL2 in the conventional display device may be larger than that of the display device in accordance with an embodiment of the present disclosure.

When the external light is incident onto the conventional display device, the external light may be reflected by the 1-1-th and 2-1-th electrodes REL1 and REL2 that completely cover the corresponding partition wall, and be visually recognized from the outside (e.g., recognized by the user). Therefore, the image quality of the conventional display device may be deteriorated due to an increase in the reflectance of external light.

Thus, in an embodiment of the present disclosure, the 1-1-th and 2-1-th electrodes REL1 and REL2 are disposed to overlap only a portion of the corresponding partition wall such that deterioration of image quality due to the external light is reduced or minimized.

FIGS. 8a to 8h are sectional views sequentially illustrating a method of manufacturing the display device shown in FIG. 6a.

Referring to FIGS. 1 to 8a, the pixel circuit component PCL is formed on the substrate SUB.

The pixel circuit component PCL includes the first and second transistors T1 and T2, the first and second alignment lines ARL1 and ARL2, and the passivation layer PSV.

Each of the first and second transistors T1 and T2 may include the semiconductor layer SCL provided on the buffer layer BFL on the substrate SUB, the gate electrode GE provided on the semiconductor layer SCL with the gate insulating layer GI being interposed therebetween, and the first and second transistor electrodes EL1 and EL2 coupled to the semiconductor layer SCL.

A portion of the first transistor electrode EL1 of the first transistor T1 may be exposed to the outside by the first contact opening CH1, which is formed through the passivation layer PSV.

The first and second alignment lines ARL1 and ARL2 may be formed on the interlayer insulating layer ILD. The first and second alignment lines ARL1 and ARL2 may be provided on the same layer as the first and second transistor electrodes EL1 and EL2 and may include the same material as the first and second transistor electrodes EL1 and EL2.

A portion of the first alignment line ARL1 may be exposed to the outside through the second contact hole CH2 that is formed through the passivation layer PSV, and a portion of the second alignment line ARL2 may be exposed to the outside through the third contact hole CH3 that is formed through the passivation layer PSV. Referring to FIGS. 1 to 8b, the first and second partition walls PW1 and PW2 are formed on the passivation layer PSV.

The first and second partition walls PW1 and PW2 may be provided on the passivation layer PSV to be spaced apart from each other by a distance (e.g., a predetermined distance). In an embodiment of the present disclosure, the first and second partition walls PW1 and PW2 may include (or may be formed of) an organic insulating layer, which allows for easier adjustments to the inclination.

Each of the first and second partition walls PW1 and PW2 may have a curved cross-section, for example, a semi-circular or semi-elliptical cross-section. In an embodiment, the cross-section of each of the first and second partition walls PW1 and PW2 may have a trapezoidal shape with the side surfaces S2 and S3 that are inclined at an inclination (e.g., at a predetermined inclination) (see, e.g., FIGS. 6b and 7b).

Referring to FIGS. 1 to 8c, the first and second electrodes REL1 and REL2 including a conductive material having high reflectance (e.g., a highly-reflective conductive material) are formed on the passivation layer PSV on which the first and second partition walls PW1 and PW2 are provided.

The first electrode REL1 may be provided on the passivation layer PSV and on a portion of (e.g., a side surface of) the first partition wall PW1 (or on the second side surface S3 of the first partition wall PW1 in the embodiment shown in, for example, FIG. 6b). The second electrode REL2 may be provided on the passivation layer PSV and on the second partition wall PW2 (e.g., on the second side surface S3 of the second partition wall PW2 in the embodiment shown in, for example, FIG. 6b).

The first electrode REL1 provided on the passivation layer PSV may be electrically coupled to the first transistor electrode EL1 of the first transistor T1 through the first contact opening CH1.

Furthermore, the first electrode REL1 provided on the passivation layer PSV may be electrically coupled to the first alignment line ARL1 through the second contact opening CH2 (see, e.g., FIG. 5).

The second electrode REL2 provided on the passivation layer PSV may be electrically coupled to the second alignment line ARL2 through the third contact opening CH3.

The first electrode REL1 provided on a side surface of the first partition wall PW1 may correspond to the shape of the first partition wall PW1. Likewise, the second electrode REL2 provided on a side surface of the second partition wall PW2 may correspond to the shape of the second partition wall PW2.

Referring to FIGS. 1 to 8d, the first and second encapsulation layers CPL1 and CPL2 including a transparent conductive material are formed on the passivation layer PSV on which the first and second electrodes REL1 and REL2 are formed.

Referring to FIGS. 1 to 8e, a first insulting-material layer is deposited on the entire passivation layer PSV on which the first and second encapsulation layers CPL1 and CPL2 are provided.

Subsequently, the first alignment voltage is applied to the first alignment line ARL1 and the second alignment voltage is applied to the second alignment line ARL2 to form an electric field between the first and second electrodes REL1 and REL2.

The first alignment voltage may be a ground voltage, and the second alignment voltage may be an AC voltage.

As voltages (e.g., predetermined voltages) having different levels are applied to the first alignment line ARL1 and the second alignment line ARL2, respectively, an electric field may be formed between the first electrode REL1 and the second electrode REL2.

The ground voltage GND is applied to the first electrode REL1 so as not to affect the electrical characteristics of the first transistor T1 coupled to the first electrode REL1.

In an embodiment of the present disclosure, the first electrode REL1 is the anode electrode, and therefore, the first transistor T1 may be affected (e.g., negatively affected) when an AC or DC voltage having a voltage level other than the ground voltage GND is applied to the first electrode REL1. When an AC or DC voltage having a voltage level other than the ground voltage is applied to the first electrode REL1, the electrical characteristics of the first transistor T1 may be changed such that the pixel circuit component PCL may malfunction.

Thereby, in an embodiment of the present disclosure, to prevent the pixel circuit component PCL from malfunctioning, the ground voltage GND may be applied to the first electrode REL1, and the AC or DC voltage having a voltage level may be applied to the second electrode REL2.

As described above, when an electric field is formed between the first and second electrodes REL1 and REL2, the rod-type LEDs LD may be distributed on (e.g., aligned on) the substrate SUB.

As an example of a method of distributing the rod-type LEDs LD, an inkjet printing method may be used. The inkjet printing method may include a method of placing a nozzle on the substrate SUB, dropping solution including the rod-type LEDs LD through the nozzle, and distributing the rod-type LEDs LD on the substrate SUB. The method of distributing the rod-type LEDs LD on the substrate SUB is not limited thereto.

After the rod-type LEDs LD are distributed on the substrate SUB, self-alignment of the rod-type LEDs LD may be induced due to the electric field that is formed 20) between the first electrode REL1 and the second electrode REL2.

When the rod-type LEDs LD have been aligned, the supply of the first and second alignment voltages may be stopped.

Subsequently, the first insulating layer IL1 provided under each of the rod-type LEDs LD is formed by patterning the first insulating-material layer through a mask process.

Referring to FIGS. 1 to 8f, a second insulating-material layer is deposited on the passivation layer PSV on which the rod-type LEDs LD are aligned, and the second insulating layer IL2 is formed to expose the opposite ends EP1 and EP2 of each of the rod-type LEDs LD through a mask process.

A portion of each of the first and second alignment lines ARL1 and ARL2 may be removed during the mask process. Thus, the first alignment line ARL1 may be provided to correspond to one pixel PXL.

Subsequently, the first contact electrode CNE1 is formed on the passivation layer PSV on which the second insulating layer IL2 is formed.

The first contact electrode CNE1 may cover the first electrode REL1 and the first end EP1 of each of the rod-type LEDs LD. The first electrode REL1 may be electrically coupled to the first end EP1 of each of the rod-type LEDs LD through the first contact electrode CNE1.

Referring to FIGS. 1 to 8g, after a third insulating-material layer is deposited on the passivation layer PSV on which the first contact electrode CNE1 is provided, the third insulating layer IL3 is formed to cover the first contact electrode CNE1 by using the mask process.

Subsequently, the second contact electrode CNE2 is formed on the passivation layer PSV on which the third insulating layer IL3 is formed.

The second contact electrode CNE2 may cover the second electrode REL2 and the second end EP2 of each of the rod-type LEDs LD. The second electrode REL2 may be electrically coupled to the second end EP2 of each of the rod-type LEDs LD through the second contact electrode CNE2.

Referring to FIGS. 1 to 8h, the fourth insulating layer IL4 is formed on the entire passivation layer PSV on which the second contact electrode CNE2 is disposed.

Subsequently, the overcoat layer OC is formed on the fourth insulating layer IL4, and the polarizing film POL is formed on the overcoat layer OC.

Figure 9:
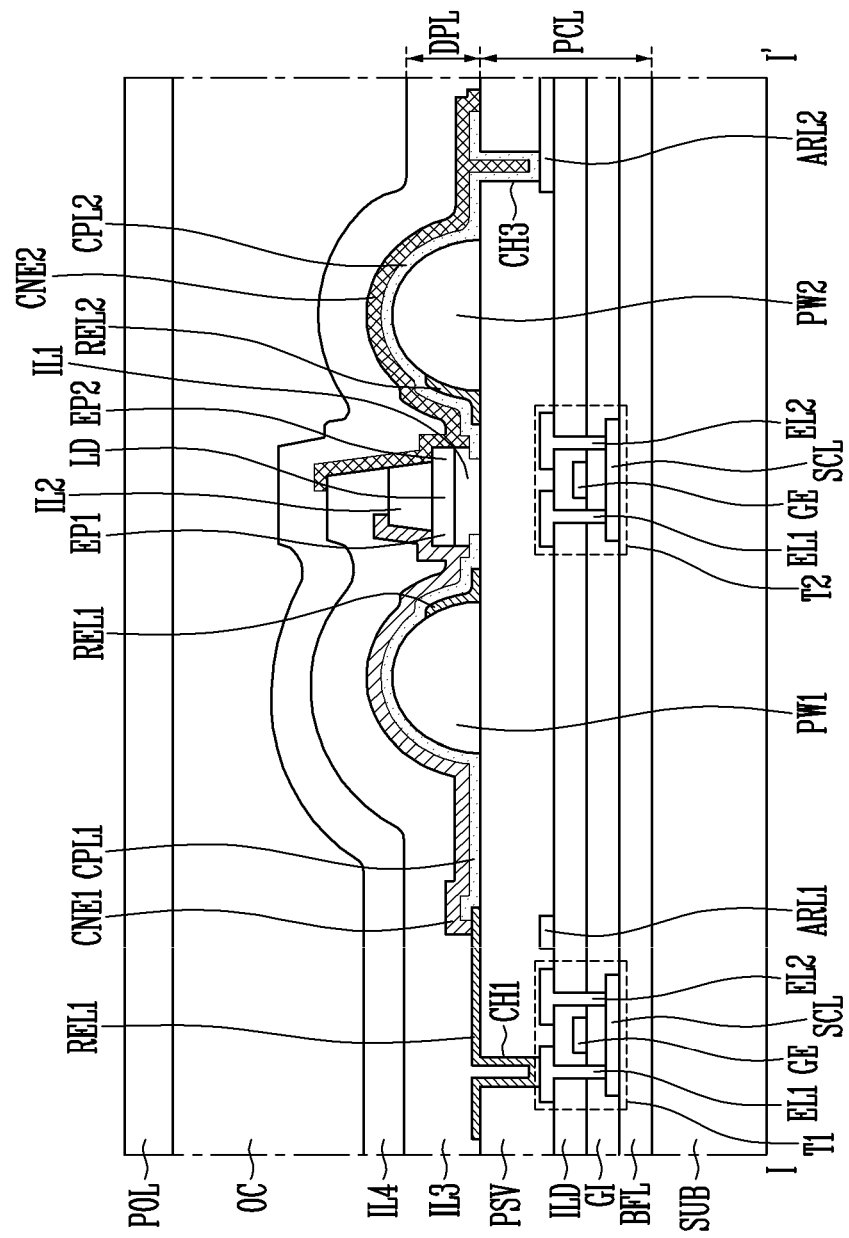
FIGS. 9 to 12 are sectional views corresponding to the line I-I' of FIG. 5 and illustrate a display device in accordance with embodiments of the present disclosure.

FIG. 9 is a sectional view corresponding to line I-I' of FIG. 5 illustrating a display device in accordance with another embodiment of the present disclosure. The following description of the embodiment shown in FIG. 9 will focus on differences from the foregoing embodiments to avoid repetitive explanation. Components which are not separately explained in the following description of the present embodiment are the same or substantially similar to that of the foregoing embodiments. The same reference numeral will be used to designate the same component, and a similar reference numeral will be used to designate a similar component.

The display device shown in FIG. 9 may have substantially the same or similar configuration as or to the display device shown in FIG. 6a, except that the second alignment line is electrically coupled to the second electrode through the second encapsulation layer.

Referring to FIGS. 5 to 9, the display device in accordance with an embodiment of the present disclosure may include a substrate SUB, a pixel circuit component PCL provided on the substrate SUB, a display element layer DPL provided on the pixel circuit component PCL, and an overcoat layer OC provided on the display element layer DPL.

The pixel circuit component PCL may include a buffer layer BFL disposed on the substrate SUB, first and second transistors T1 and T2 disposed on the buffer layer BFL, first and second alignment lines ARL1 and ARL2, and a passivation layer PSV.

The display element layer DPL may include first and second partition walls PW1 and PW2, a plurality of rod-type LEDs LD, first and second electrodes REL1 and REL2, first and second encapsulation layers CPL1 and CPL2, and first and second contact electrodes CNE1 and CNE2.

The first electrode REL1 may be disposed on the side surface of the first partition wall PW1 and the passivation layer PSV. The second electrode REL2 may be disposed on the side surface of the second partition wall PW2 and the passivation layer PSV.

In an embodiment of the present disclosure, the second electrode REL2 may be provided in one pixel PXL so as not to overlap the second alignment line ARL2. In this embodiment, the second alignment line ARL2 and the second electrode REL2 may be electrically coupled through the second encapsulation layer CPL2 that covers the second electrode REL2.

The second encapsulation layer CPL2 may be electrically coupled to the second alignment line ARL2 through the third contact opening CH3 that is formed through the passivation layer PSV. Furthermore, the second encapsulation layer CPL2 may be directly provided on the second electrode REL2 disposed on the side surface of the second partition wall PW to be electrically coupled to the second electrode REL2.

Thus, the second electrode REL2 may be finally coupled to the second alignment line ARL2 via the second encapsulation layer CPL2.

Consequently, when the rod-type LEDs LD are aligned in the one pixel PXL, the second alignment voltage of the second alignment line ARL2 may be applied through the second encapsulation layer CPL2 to the second electrode REL2. Furthermore, when the rod-type LEDs LD are driven, the second driving power supply VSS (see, e.g., FIG. 4) applied to the second alignment line ARL2 may be transmitted through the second encapsulation layer CPL2 to the second electrode REL2.

Figure 10:
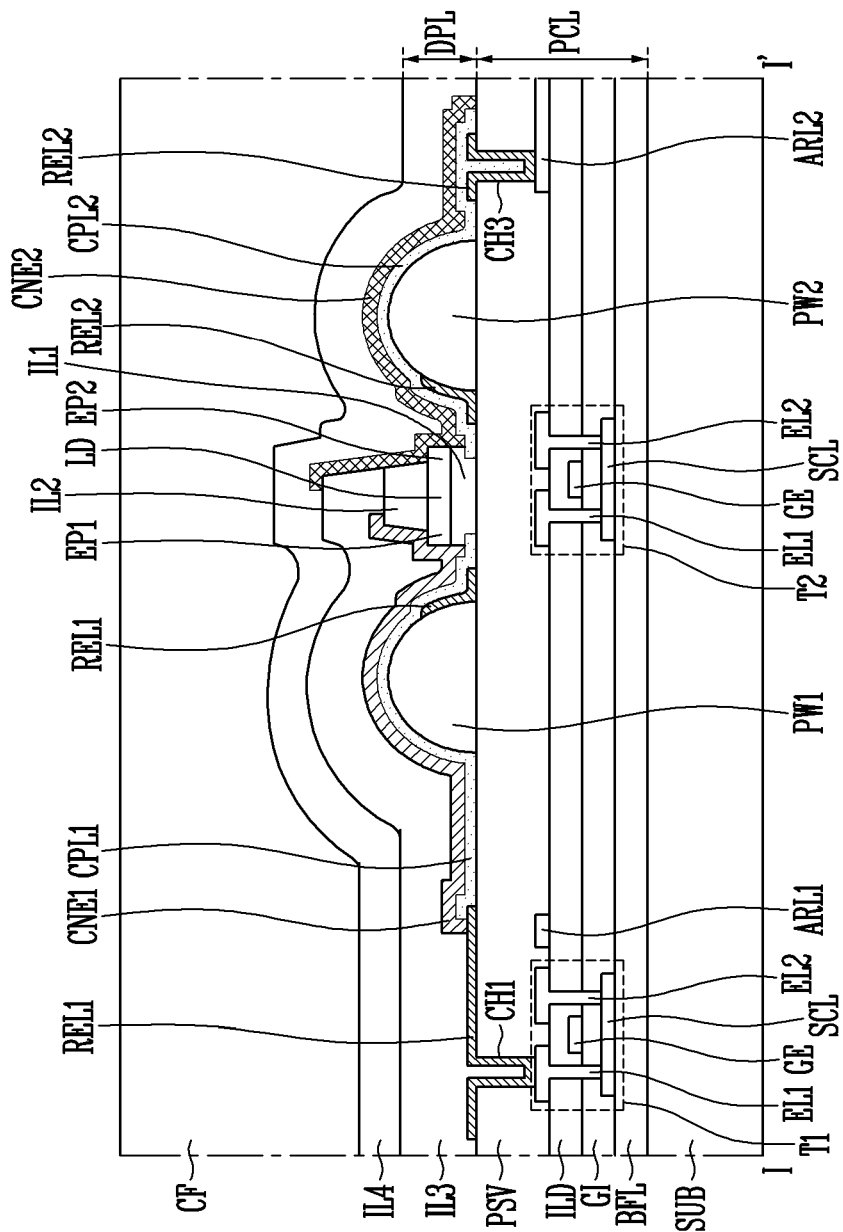
Figure 11:
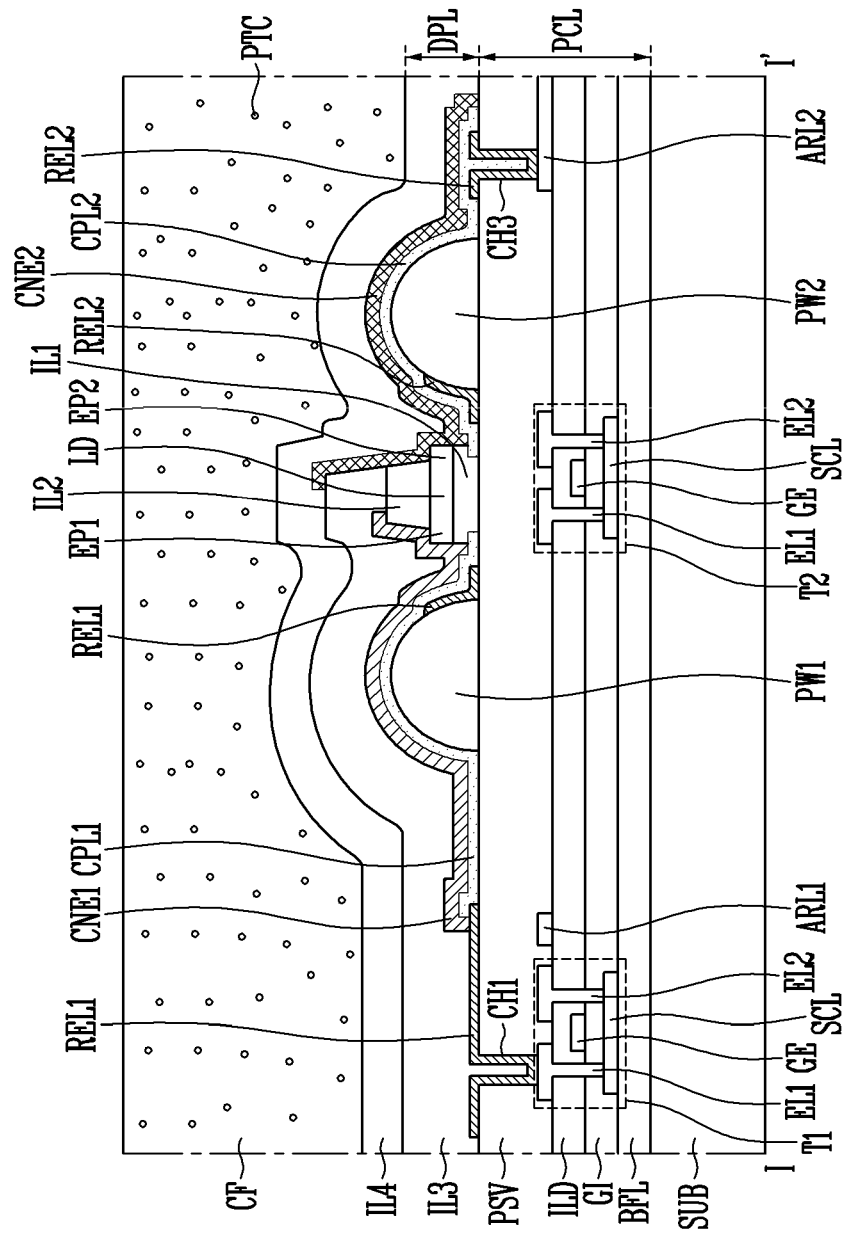

FIGS. 10 and 11 each are a sectional views corresponding to the line I-I' of FIG. 5 illustrating a display device in accordance with other embodiments of the present disclosure. The following descriptions will focus on differences from the foregoing embodiments to avoid repetitive explanation. Components which are not separately explained in the following descriptions of these embodiments are the same or substantially similar to that of the foregoing embodiments. The same reference numeral will be used to designate the same component, and a similar reference numeral will be used to designate a similar component.

The display device shown in FIGS. 10 and 11 may have substantially the same or similar configuration as or to the display device shown in FIG. 6, except that the overcoat layer OC is provided as a color filter layer CF.

Referring to FIGS. 5, 10, and 11, the display device in accordance with embodiments of the present disclosure may include a substrate SUB, a pixel circuit component PCL disposed on the substrate SUB, a display element layer DPL disposed on the pixel circuit component PCL, and a color filter layer CF disposed on the display element layer DPL.

The pixel circuit component PCL may include a buffer layer BFL disposed on the substrate SUB, first and second transistors T1 and T2 disposed on the buffer layer BFL, first and second alignment lines ARL1 and ARL2, and a passivation layer PSV.

The display element layer DPL may include first and second partition walls PW1 and PW2, a plurality of rod-type LEDs LD, first and second electrodes REL1 and REL2, first and second encapsulation layers CPL1 and CPL2, and first and second contact electrodes CNE1 and CNE2.

The color filter layer CF may transmit only (or substantially only) light of a preset wavelength and block (or substantially block) light of other wavelength ranges, thus reducing the reflection of external light that is incident through the color filter layer CF. In this embodiment, the display device has the effect of reducing the reflection of external light even if a separate polarizing film is not used.

Furthermore, the color filter layer CF may act as a planarization layer for planarizing a stepped structure caused by the display element layer DPL.

In an embodiment of the present disclosure, the color filter layer CF may be formed of an organic material having the same (or substantially the same) refractive index as that of the third and fourth insulating layers IL3 and IL4 provided on the first and second electrodes REL1 and REL2.

In this embodiment, light that is emitted from the rod-type LEDs LD and is reflected by the first and second electrodes REL1 and REL2 may not be absorbed by the third and fourth insulating layers IL3 and IL4 and the color filter layer CF but may proceed in a direction in which an image is displayed. Thereby, the efficiency of light emitted from the rod-type LEDs LD can be improved.

In the embodiment illustrated in FIG. 11, the color filter layer CF may include a plurality of particles PTC.

The particles PTC may be dispersed in the color filter layer CF to control the distribution of light emitted from the rod-type LEDs LD and proceeding through the color filter layer CF.

In an embodiment of the present disclosure, the particles PTC may include particles of metallic conductive oxide or metallic conductive nitride but are not limited thereto. For example, the particles PTC may be a void that is an empty space. Examples of the metallic conductive oxide may include titanium dioxide ($TiO_2$) and zirconium oxide ($ZrO_2$).

Each of the particle's PTC may have various shapes depending on, for example, the reflective index of the color filter layer CF, the thickness of the color filter layer CF, and a distance from (or a distance between) adjacent particles PTC.

The particles PTC may be dispersed in the color filter layer CF to scatter light propagated to the color filter layer CF, thus preventing the light from being concentrated in a specific area of the color filter layer CF.

The density of the particles PTC may be adjusted differently for each area of the color filter layer CF. For example, when light propagated to the color filter layer CF is concentrated in a central area of the color filter layer CF, the particles PTC may be dispersed to be concentrated in the central area of the color filter layer CF. However, the present disclosure is not limited thereto, and its reverse is also possible.

Figure 12:
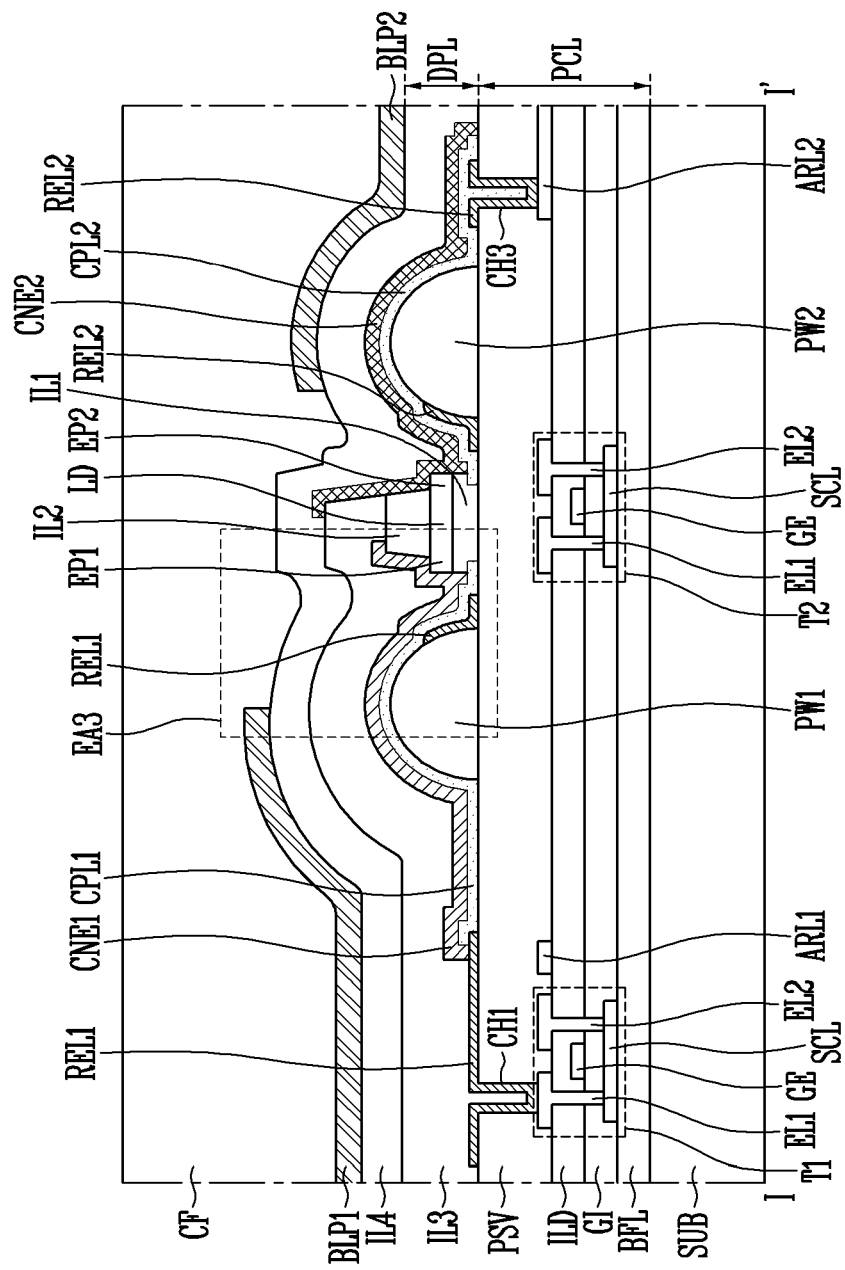
Figure 13:
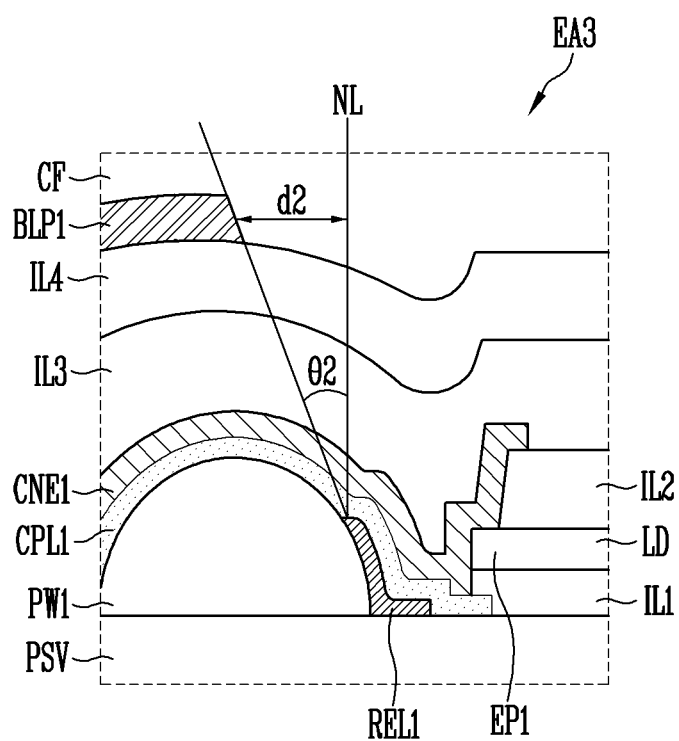
FIG. 13 is an enlarged sectional view of the area EA3 of FIG. 12.

FIG. 12 is a sectional view corresponding to the line I-I' of FIG. 5 to illustrate a display device in accordance with another embodiment of the present disclosure, and FIG. 13 is an enlarged sectional view of area EA3 of FIG. 12. The following description will focus on differences from the foregoing embodiments to avoid repetitive explanation. Components which are not separately explained in the following description of the present embodiment are the same or substantially similar to that of the foregoing embodiments. The same reference numeral will be used to designate the same component, and a similar reference numeral will be used to designate a similar component.

The display device shown in FIG. 12 has substantially the same or similar configuration as or to the display devices shown in FIGS. 5 and 11, except that a light shielding pattern is disposed between the fourth insulating layer and the overcoat layer.

Referring to FIGS. 5, 12, and 13, the display device in accordance with an embodiment of the present disclosure may include a substrate SUB, a pixel circuit component PCL provided on the substrate SUB, a display element layer DPL provided on the pixel circuit component PCL, and a color filter layer CF.

The pixel circuit component PCL may include a buffer layer BFL disposed on the substrate SUB, first and second transistors T1 and T2 disposed on the buffer layer BFL, first and second alignment lines ARL1 and ARL2, and a passivation layer PSV.

The display element layer DPL may include first and second partition walls PW1 and PW2, a plurality of rod-type LEDs LD, first and second electrodes REL1 and REL2, first and second encapsulation layers CPL1 and CPL2, and first and second contact electrodes CNE1 and CNE2.

The display device may further include first and second light shielding patterns BLP1 and BLP2 that are disposed under the color filter layer CF.

The first and second light shielding patterns BLP1 and BLP2 may include a black matrix and absorb external light incident to the display device, thus reducing reflection of external light.

The first and second light shielding patterns BLP1 and BLP2 may be provided on the fourth insulating layer IL4 of the display element layer DPL to be spaced apart from each other by a distance (e.g., by a predetermined distance), with each of the rod-type LEDs LD being interposed therebetween.

The first light shielding pattern BLP1 may cover a portion of the first partition wall PW1, and may not cover the first electrode REL1 (hereinafter, referred to as the "1-1-th electrode") disposed on the side surface S3 of the first partition wall PW1.

The second light shielding pattern BLP2 may cover a portion of the second partition wall PW2, and may not cover the second electrode REL2 (hereinafter, referred to as the "2-1-th electrode") disposed on the side surface of the second partition wall PW2.

The first light shielding pattern BLP1 may be spaced apart from the 1-1-th electrode REL1 by a distance d2 with respect to a normal line NL extending vertically from an upper end of the 1-1-th electrode REL1.

The predetermined distance d2 between the first light shielding pattern BLP1 and the 1-1-th electrode REL1 may be determined by a light output angle $\theta 2$ of the 1-1-th electrode REL1.

The light output angle $\theta 2$ may indicate an angle included in a range in which light is not absorbed by the third insulating layer IL3 and the fourth insulating layer IL4 when light emitted from the first end EP1 of each of the rod-type LEDs LD is reflected by the 1-1-th electrode REL1 in a direction in which the image is displayed.

The light output angle $\theta 2$ may be determined by the inclination of the 1-1-th electrode REL1. The inclination of the 1-1-th electrode REL1 may correspond to the inclination $\theta 1$ (see, e.g., FIG. 7) of the side surface S3 of the first partition wall PW1. Therefore, the light output angle $\theta 2$ may be determined by the inclination $\theta 1$ of the side surface S3 of the first partition wall PW1.

For example, when the inclination $\theta 1$ of the side surface S3 of the first partition wall PW1 is 28°, the light output angle $\theta 2$ of the 1-1-th electrode REL1 may be 34°. Therefore, the first light shielding pattern BLP1 may be disposed on the fourth insulating layer IL4 to have a slope that is inclined by 34° from the normal line NL to the left without covering the 1-1-th electrode REL1.

In an embodiment of the present disclosure, the second light shielding pattern BLP2 and the 2-1-th electrode REL2 may be spaced apart from each other by a predetermined distance d2 between the first light shielding pattern BLP1 and the 1-1-th electrode REL1.

The color filter layer CF may be provided on the first and second light shielding patterns BLP1 and BLP2.

The color filter layer CF may transmit only (or substantially only) light of a preset wavelength and block (or substantially block) light of other wavelength ranges, thus reducing the reflection of external light that is incident through the color filter layer CF. Furthermore, the color filter layer CF may act as a planarization layer for planarizing a stepped structure caused by the display element layer DPL.

In an embodiment of the present disclosure, the color filter layer CF may include an organic material having the same or similar refractive index as or to that of the third and fourth insulating layers IL3 and IL4 provided on the first and second electrodes REL1 and REL2.

Figure 14:
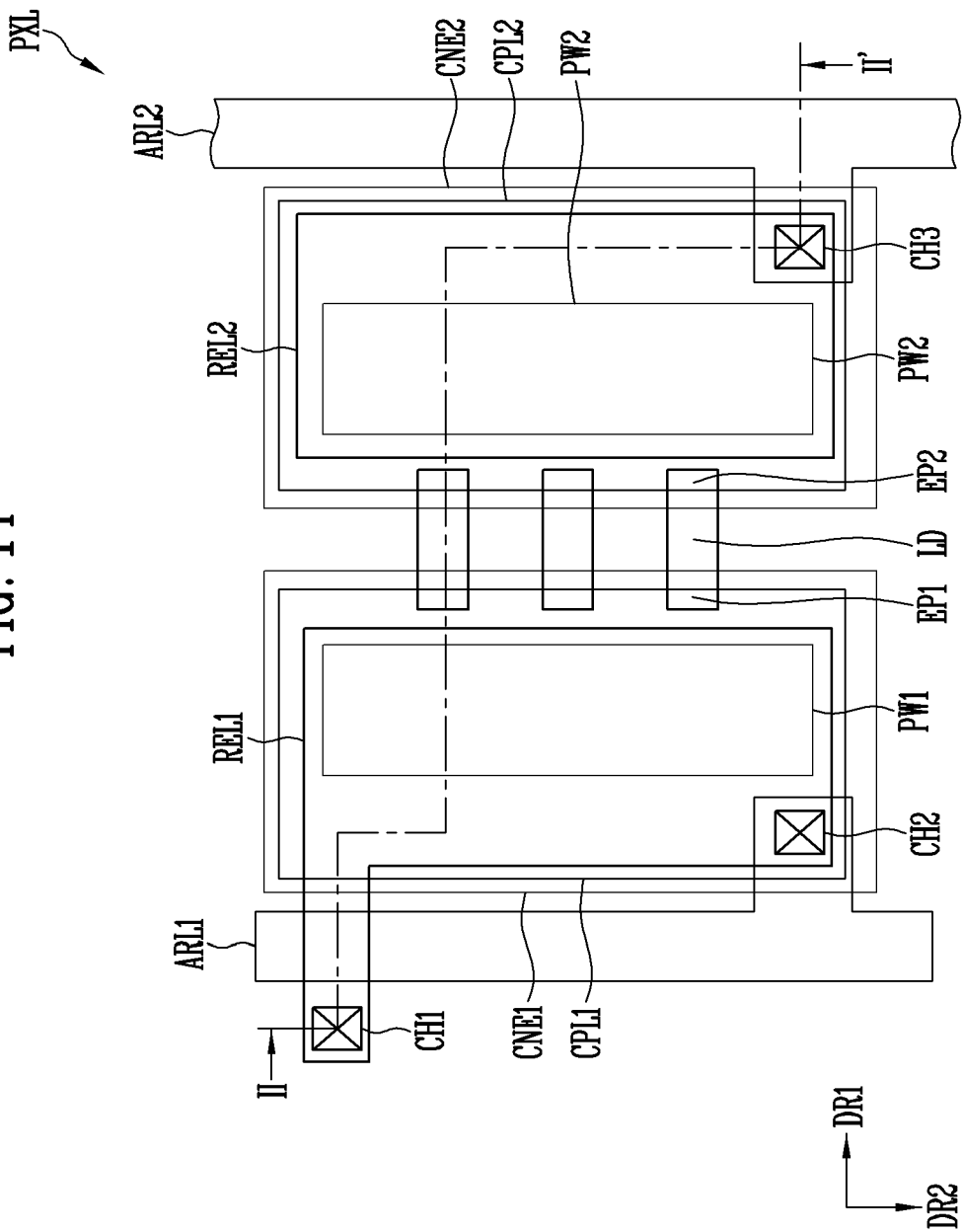
FIG. 14 is a plan view illustrating a unit light emission area of a light emitting device provided in one pixel of a display device in accordance with an embodiment of the present disclosure.
Figure 15:
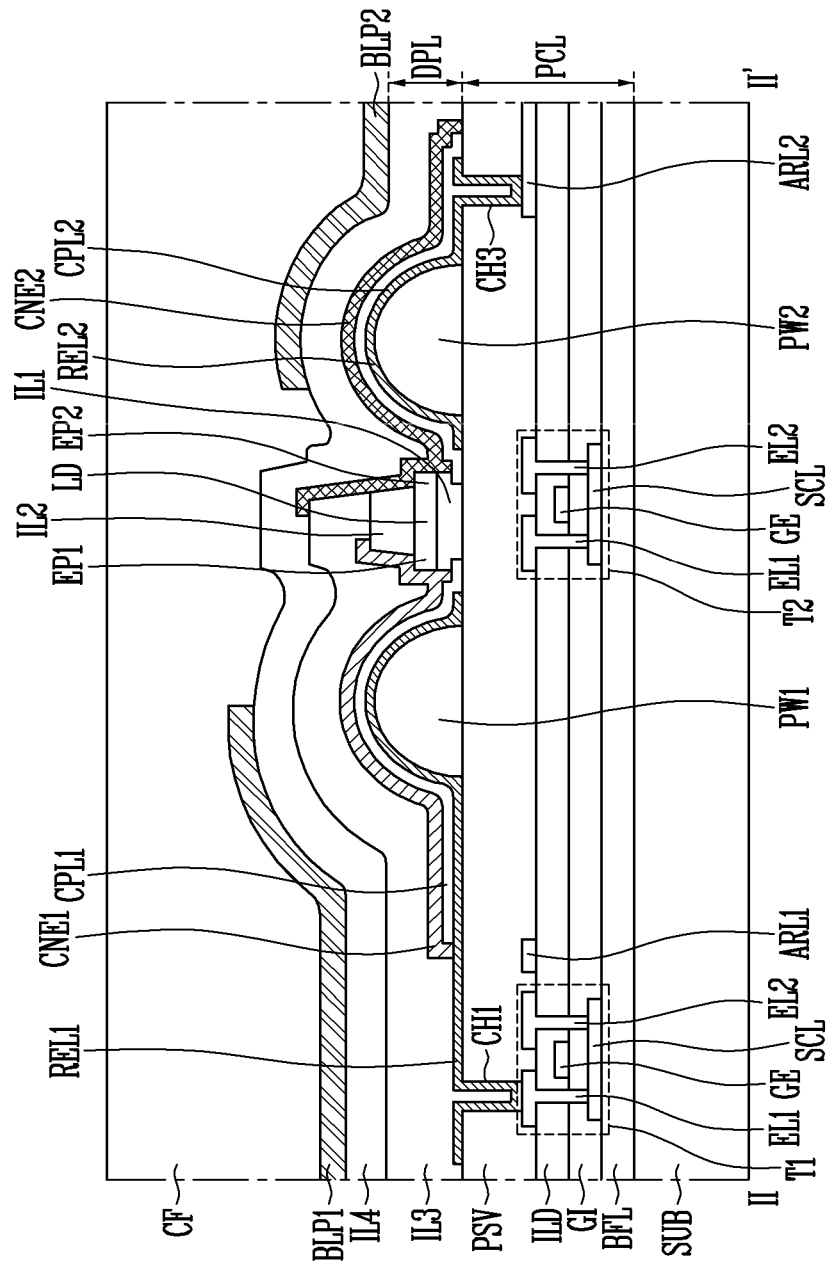
FIG. 15 is a sectional view taken along the line II-II' of FIG. 14.

FIG. 14 illustrates a display device in accordance with an embodiment of the present disclosure, particularly, FIG. 14 is a plan view illustrating a unit emission area of a light emitting device provided on one pixel, and FIG. 15 is a sectional view taken along the line II-II' of FIG. 14.

In an embodiment of the present disclosure, the following description will focus on differences from the foregoing embodiments to avoid repetitive explanation. Components which are not separately explained in the following description of the present embodiment are the same or substantially similar as that of the foregoing embodiments. The same reference numeral will be used to designate the same component, and a similar reference numeral will be used to designate a similar component.

In FIG. 14, for convenience, a plurality of rod-type LEDs is illustrated as being horizontally arranged. However, the arrangement of the rod-type LEDs is not limited thereto.

Furthermore, for convenience, illustration of transistors coupled to the rod-type LEDs and signal lines coupled to the transistors have been omitted in FIG. 14.

The display device shown in FIGS. 14 and 15 may have substantially the same or similar configuration as or to the display device of FIG. 12, except that the first electrode covers the entire first partition wall and the second electrode covers the entire second partition wall.

Referring to FIGS. 14 to 15, the display device in accordance with an embodiment of the present disclosure may include a substrate SUB, a pixel circuit component PCL provided on the substrate SUB, a display element layer DPL provided on the pixel circuit component PCL, and a color filter layer CF provided on the display element layer DPL.

The pixel circuit component PCL may include a buffer layer BFL disposed on the substrate SUB, first and second transistors T1 and T2 disposed on the buffer layer BFL, first and second alignment lines ARL1 and ARL2, and a passivation layer PSV.

The display element layer DPL may include first and second partition walls PW1 and PW2, a plurality of rod-type LEDs LD, first and second electrodes REL1 and REL2, and first and second contact electrodes CNE1 and CNE2.

When viewed on the plane, the first electrode REL1 may completely cover the first partition wall PW1, and the second electrode REL2 may completely cover the second partition wall PW2.

The color filter layer CF may act as a planarization layer for planarizing a stepped structure caused by the display element layer DPL.

In an embodiment of the present disclosure, the color filter layer CF may include (or may be formed of) an organic material having the same (or substantially the same) refractive index as that of the third and fourth insulating layers IL3 and IL4 provided on the first and second electrodes REL1 and REL2.

The display device may further include first and second light shielding patterns BLP1 and BLP2 that are disposed between the color filter layer CF and the fourth insulating layer IL4.

The first and second light shielding patterns BLP1 and BLP2 may include a black matrix and may absorb external light incident on the display device, thus reducing the reflection of external light.

In an embodiment of the present disclosure, the first light shielding pattern BLP1 may cover a portion of the first electrode REL1, and the second light shielding pattern BLP2 may cover a portion of the second electrode REL2.

Because the first and second electrodes REL1 and REL2 completely cover the corresponding partition wall, a portion of (e.g., a substantially portion of) the external light incident on the display device may be reflected by the first and second electrodes REL1 and REL2.

In this embodiment, the first and second light shielding patterns BLP1 and BLP2 may absorb external light reflected by the first and second electrodes REL1 and REL2. Therefore, components disposed under the first and second light shielding patterns BLP1 and BLP2 may not be visually recognized from the outside.

The display device in accordance with embodiments of the present disclosure may be employed in various electronic devices. For instance, the display device may be applied to a television, a notebook computer, a cellular phone, a smartphone, a smartpad (PD), a portable multimedia player (PMP), a personal digital assistant (PDA), a navigation device, various kinds of wearable devices, such as a smartwatch, etc.

While various exemplary embodiments have been described above, those skilled in the art will appreciate that various modifications, additions, and substitutions are possible, without departing from the scope and spirit of the present disclosure.

Therefore, the embodiments disclosed in this specification are for illustrative purposes and do not limit the technical spirit of the present disclosure. The scope of the present disclosure must be defined by the accompanying claims and their equivalents.

The invention claimed is:

1. A light emitting device comprising:
a substrate;
a light emitting element on the substrate, the light emitting element having a first end and a second end in a longitudinal direction;
first and second banks on the substrate, the first and second banks being spaced apart from each other in a first direction by a distance with the light emitting element interposed therebetween;
a first electrode on the first bank and adjacent to the first end of the light emitting element;
a second electrode on the second bank and adjacent to the second end of the light emitting element;
a first contact electrode coupling the first electrode and the first end of the light emitting element;
a second contact electrode coupling the second electrode and the second end of the light emitting element;
a first encapsulation layer between the first electrode and the first contact electrode and covering the first electrode; and
a second encapsulation layer between the second electrode and the second contact electrode and covering the second electrode,
wherein the first electrode is disposed only on a first side of the first bank, partially overlaps the first side of the first bank, and exposes a second side of the first bank excluding the first side of the first bank, and
wherein the second electrode is disposed only on a first side of the second bank, partially overlaps the first side of the second bank, and exposes a second side of the second bank excluding the first side of the second bank.

2. The light emitting device according to claim 1, further comprising:
a passivation layer between the first and second banks and the substrate;
a first insulating layer between the passivation layer and the light emitting element;
a second insulating layer on the light emitting element and exposing the first and second ends of the light emitting element to an outside;
a third insulating layer on and covering the first contact electrode; and
a fourth insulating layer on and covering the second contact electrode,
wherein the third insulating layer and the fourth insulating layer comprise an insulating material having the same refractive index as that of the first and second electrodes.

3. The light emitting device according to claim 2, further comprising:
first and second alignment lines between the substrate and the passivation layer and extending in one direction when viewed on a plane, wherein the first alignment line is electrically coupled to the first electrode, and the second alignment line is electrically coupled to the second electrode.

4. The light emitting device according to claim 1, wherein the light emitting element comprises:
   a first semiconductor layer doped with a first conductive dopant;
   a second semiconductor layer doped with a second conductive dopant; and
   an active layer between the first semiconductor layer and the second semiconductor layer.

5. The light emitting device according to claim 4, wherein the light emitting element comprises a light emitting diode having a cylindrical shape having a micro scale or a nano scale or a prismatic shape having a micro scale or a nano scale.

6. A display device comprising:
   a substrate having a display area and a non-display area;
   a pixel circuit component in the display area of the substrate, the pixel circuit component comprising a transistor and a passivation layer on the transistor; and
   a display element layer on the passivation layer, the display element layer comprising a light emitting element having a first end and a second end in a longitudinal direction,
   wherein the display element layer comprises:
      first and second banks on the passivation layer and spaced apart from each other in a first direction by a distance with the light emitting element interposed therebetween;
      a first electrode on the first bank and adjacent to the first end of the light emitting element;
      a second electrode on the second banks and adjacent to the second end of the light emitting element;
      a first contact electrode coupling the first electrode and the first end of the light emitting element; and
      a second contact electrode coupling the second electrode and the second end of the light emitting element, and
   wherein the first electrode is disposed only on a first side of the first bank, partially overlaps the first side of the first bank, and exposed a second side of the first bank, and
   wherein the second electrode is disposed only on a first side of the second bank, partially overlaps the first side of the second bank, and exposes a second side of the second bank excluding the first side of the second bank.

7. The display device according to claim 6, further comprising:
   first and second alignment lines between the substrate and the passivation layer and extending in a column direction when viewed on a plane,
   wherein the first alignment line is electrically coupled to the first electrode, and the second alignment line is electrically coupled to the second electrode.

8. The display device according to claim 7, further comprising:
   a first insulating layer between the passivation layer and the light emitting element;
   a second insulating layer on the light emitting element and exposing the first and second ends of the light emitting element to an outside;
   a third insulating layer on and covering the first contact electrode; and
   a fourth insulating layer on and covering the second contact electrode,
   wherein the third insulating layer and the fourth insulating layer comprise an insulating material having the same refractive index as that of the first and second electrodes.

9. The display device according to claim 8, further comprising:
   a planarization layer on the fourth insulating layer and having the same refractive index as that of the fourth insulating layer.

10. The display device according to claim 8, further comprising:
   a color filter layer on the fourth insulating layer and having the same refractive index as that of the fourth insulating layer.

11. The display device according to claim 10, wherein the color filter layer comprises light scattering particles dispersed in the color filter layer.

12. The display device according to claim 10, further comprising:
   a light shielding pattern between the fourth insulating layer and the color filter layer,
   wherein the light shielding pattern comprises a black matrix and partially corresponds to each of the first and second banks.

13. The display device according to claim 6, wherein the light emitting element comprises:
   a first conductive semiconductor layer doped with a first conductive dopant;
   a second conductive semiconductor layer doped with a second conductive dopant; and
   an active layer between the first conductive semiconductor layer and the second conductive semiconductor layer.

14. The display device according to claim 13, wherein the light emitting element comprises a light emitting diode of a cylindrical shape having a micro scale or a nano scale or a prismatic shape having a micro scale or a nano scale.

15. A display device comprising:
   a substrate having a display area and a non-display area;
   a pixel circuit component in the display area of the substrate and comprising a transistor and a passivation layer on the transistor; and
   a display element layer on the passivation layer and comprising at least one light emitting element having a first end and a second end in a longitudinal direction,
   wherein the display element layer comprises:
      first and second banks on the passivation layer and spaced apart from each other by a distance with the light emitting element interposed therebetween;
      a first electrode on the first bank;
      a second electrode on the second bank;
      a first contact electrode coupling the first electrode and the first end of the light emitting element;
      a second contact electrode coupling the second electrode and the second end of the light emitting element;
      an insulating layer on the first and second contact electrodes;
      a light shielding pattern disposed only on a portion of the insulating layer, overlapping the portion of the insulating layer, and exposing the insulating layer on the light emitting element; and
      a color filter layer on the light shielding pattern,
   wherein, when viewed on a plane, the first electrode completely overlaps the first bank, and the second electrode completely overlaps the second bank, and wherein the color filter layer has the same refractive index as that of the insulating layer.

16. The display device according to claim 15, wherein the light shielding pattern comprises a black matrix, and covers a portion of the first electrode and a portion of the second electrode.

17. The display device according to claim 16, wherein the insulating layer comprises an insulating material having the same refractive index as that of the first and second electrodes.

18. The display device according to claim 15, wherein the display element layer further comprises:
- a first encapsulation layer between the first electrode and the first contact electrode and covering the first electrode; and
- a second encapsulation layer between the second electrode and the second contact electrode and covering the second electrode.

\* \* \* \* \*